United States Patent
Huang et al.

(10) Patent No.: US 11,508,615 B2
(45) Date of Patent: Nov. 22, 2022

(54) SEMICONDUCTOR DEVICE STRUCTURE AND METHODS OF FORMING THE SAME

(71) Applicant: TAIWAN SEMICONDUCTOR MANUFACTURING CO., LTD., Hsinchu (TW)

(72) Inventors: Lin-Yu Huang, Hsinchu (TW); Li-Zhen Yu, New Taipei (TW); Chia-Hao Chang, Hsinchu (TW); Cheng-Chi Chuang, New Taipei (TW); Kuan-Lun Cheng, Hsinchu (TW); Chih-Hao Wang, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 46 days.

(21) Appl. No.: 16/943,996

(22) Filed: Jul. 30, 2020

(65) Prior Publication Data
US 2022/0037190 A1    Feb. 3, 2022

(51) Int. Cl.
*H01L 21/768* (2006.01)
*H01L 23/532* (2006.01)

(52) U.S. Cl.
CPC ...... *H01L 21/7682* (2013.01); *H01L 23/5329* (2013.01)

(58) Field of Classification Search
CPC ........... H01L 21/7682; H01L 21/76807; H01L 23/5222; H01L 23/5329; H01L 23/53238
See application file for complete search history.

(56) References Cited

U.S. PATENT DOCUMENTS

| | | | |
|---|---|---|---|
| 7,094,669 B2* | 8/2006 | Bu | H01L 21/76807 257/E21.581 |
| 7,560,375 B2* | 7/2009 | Filippi | H01L 21/76807 438/619 |
| 9,721,897 B1* | 8/2017 | Cheng | H01L 29/6653 |
| 10,361,152 B2* | 7/2019 | Su | H01L 23/53238 |
| 10,410,916 B2* | 9/2019 | Hong | H01L 23/53295 |

(Continued)

OTHER PUBLICATIONS

U.S. Appl. No. 16/935,135, filed Jul. 21, 2020.

*Primary Examiner* — Monica D Harrison
*Assistant Examiner* — John M Parker
(74) *Attorney, Agent, or Firm* — NZ Carr Law Office

(57) ABSTRACT

A semiconductor device structure, along with methods of forming such, are described. The semiconductor device structure includes a device, a conductive structure disposed over the device, and the conductive structure includes a sidewall having a first portion and a second portion. The semiconductor device structure further includes a first spacer layer including a third portion and a fourth portion, the third portion surrounds the first portion of the sidewall, and the fourth portion is disposed on the conductive structure. The semiconductor device structure further includes a first dielectric material surrounding the third portion, and an air gap is formed between the first dielectric material and the third portion of the first spacer layer. The first dielectric material includes a first material different than a second material of the first spacer layer, and the first dielectric material is substantially coplanar with the fourth portion of the first spacer layer.

20 Claims, 28 Drawing Sheets

(56) References Cited

U.S. PATENT DOCUMENTS

| | | | | |
|---|---|---|---|---|
| 10,748,812 B1* | 8/2020 | Cheng | ............... | H01L 23/53209 |
| 2002/0158337 A1* | 10/2002 | Babich | .............. | H01L 21/76835 |
| | | | | 257/758 |
| 2013/0207269 A1* | 8/2013 | Oshida | ................ | H01L 21/7682 |
| | | | | 257/762 |
| 2020/0020697 A1* | 1/2020 | Kim | .................. | H01L 27/10888 |
| 2020/0350198 A1* | 11/2020 | Saito | ................. | H01L 27/14621 |
| 2020/0357680 A1* | 11/2020 | Eto | ................... | H01L 21/76834 |
| 2021/0118935 A1* | 4/2021 | Haneda | .................. | H04N 5/374 |
| 2022/0028780 A1* | 1/2022 | Huang | ............. | H01L 21/76834 |

\* cited by examiner

SEMICONDUCTOR DEVICE STRUCTURE AND METHODS OF FORMING THE SAME

BACKGROUND

As the semiconductor industry introduces new generations of integrated circuits (IC) having higher performance and more functionality, the density of the elements forming the ICs increases, while the dimensions, sizes and spacing between components or elements are reduced. In the past, such reductions were limited only by the ability to define the structures photo-lithographically, device geometries having smaller dimensions created new limiting factors. For example, for any two adjacent conductive features, as the distance between the conductive features decreases, the resulting capacitance (a function of the dielectric constant (k value) of the insulating material divided by the distance between the conductive features) increases. This increased capacitance results in increased capacitive coupling between the conductive features, increased power consumption, and an increase in the resistive-capacitive (RC) time constant.

Therefore, there is a need to solve the above problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-18A are cross-sectional side views of various stages of manufacturing the semiconductor device structure taken along line A-A of FIG. 1, in accordance with some embodiments.

FIGS. 2B-18B are cross-sectional side views of various stages of manufacturing the semiconductor device structure taken along line B-B of FIG. 1, in accordance with some embodiments.

FIGS. 20A-28A are cross-sectional side views of various stages of manufacturing the semiconductor device structure taken along line A-A of FIG. 1, in accordance with some embodiments.

FIGS. 20B-28B are cross-sectional side views of various stages of manufacturing the semiconductor device structure taken along line B-B of FIG. 1, in accordance with some embodiments.

DETAILED DESCRIPTION

Figure 1:
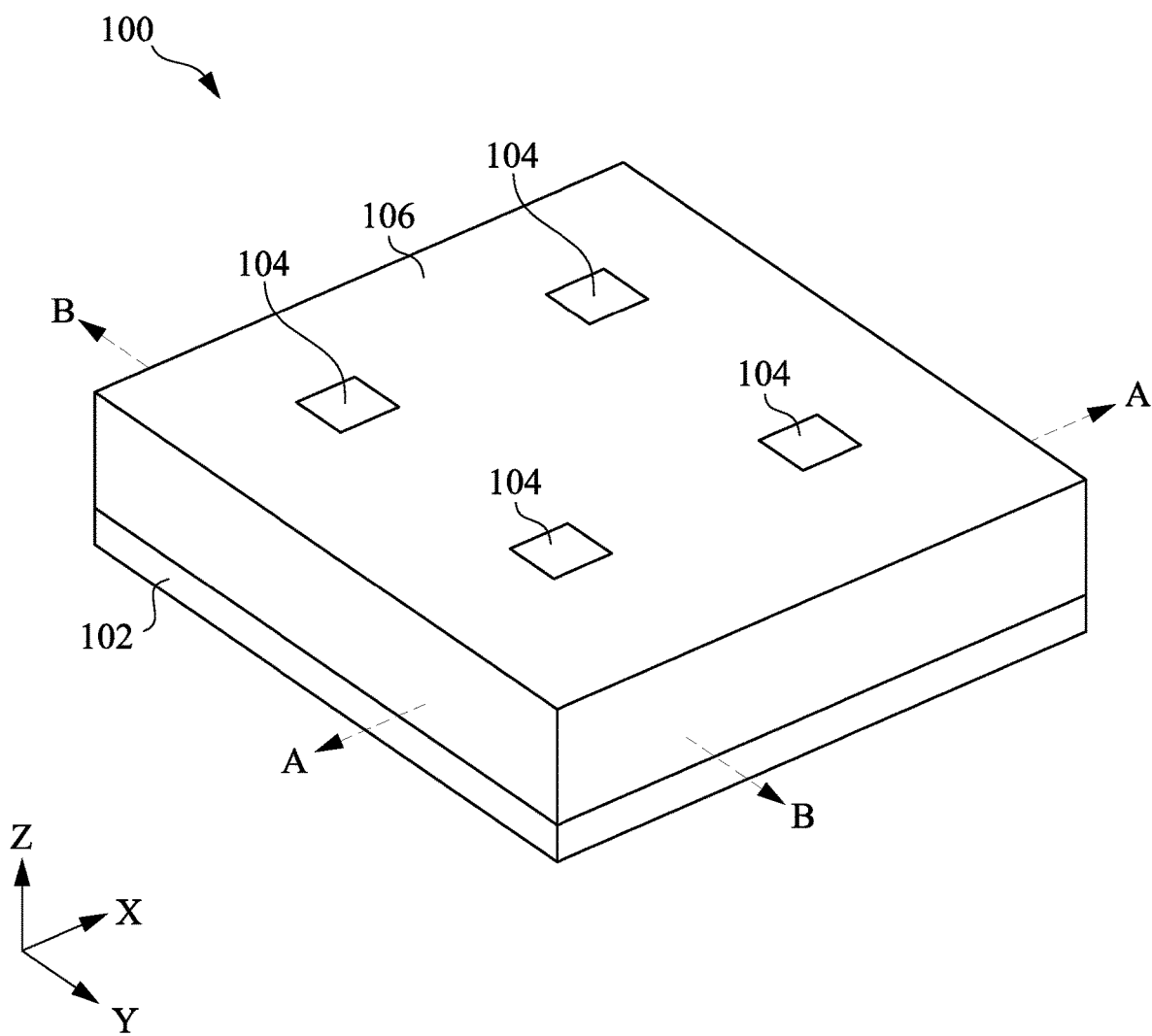
FIG. 1 is a perspective view of one of the various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-22B show exemplary sequential processes for manufacturing a semiconductor device structure 100, in accordance with some embodiments. It is understood that additional operations can be provided before, during, and after processes shown by FIGS. 1-22B, and some of the operations described below can be replaced or eliminated, for additional embodiments of the process. The order of the operations/processes may be interchangeable. FIGS. 23A-28B show alternate sequential processes for manufacturing the semiconductor device structure 100, in accordance with some embodiments. It is understood that additional operations can be provided before, during, and after processes shown by FIGS. 23A-28B, and some of the operations described below can be replaced or eliminated, for additional embodiments of the process. The order of the operations/processes may be interchangeable.

FIG. 1 is a perspective view of one of the various stages of manufacturing a semiconductor device structure 100, in accordance with some embodiments. As shown in FIG. 1, the semiconductor device structure 100 includes a substrate 102 having at least a plurality of conductive features 104 formed thereover. The conductive features 104 are formed in a dielectric material 106. One or more devices, such as transistors, diodes, imaging sensors, resistors, capacitors, inductors, memory cells, a combination thereof, and/or other suitable devices, may be formed between the substrate 102 and the conductive features 104.

Figure 2A:
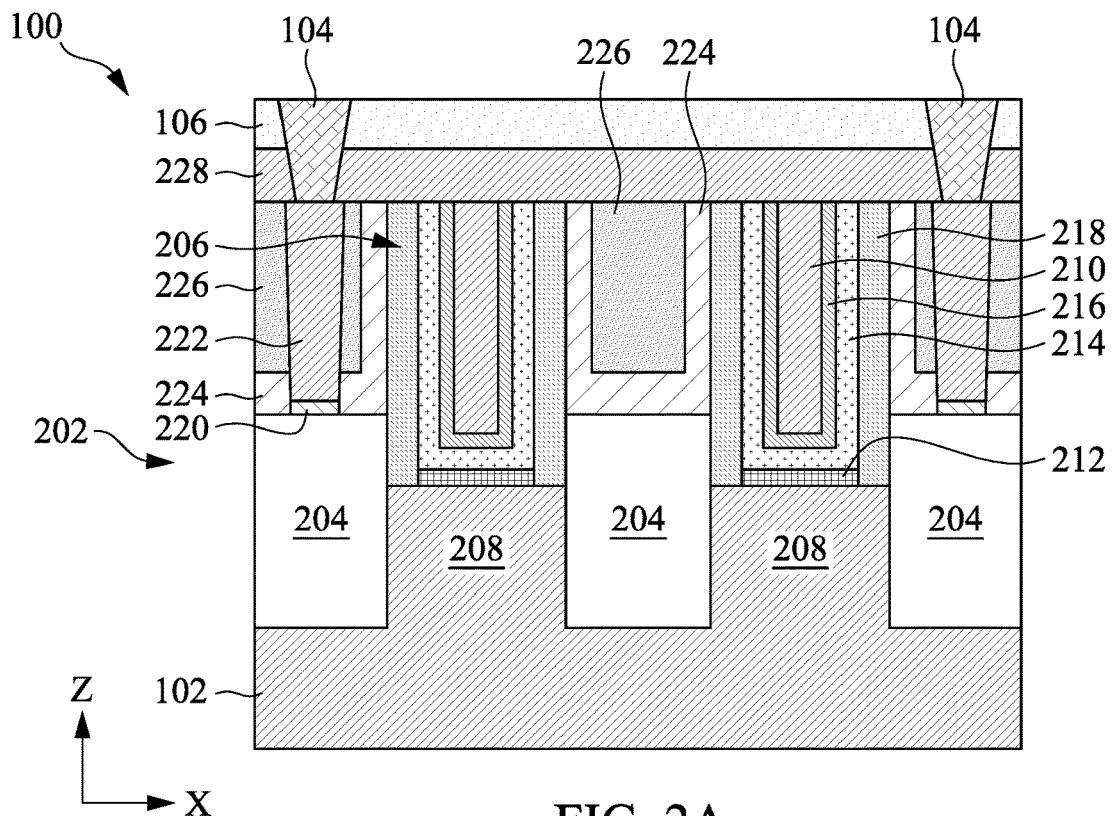
Figure 2B:
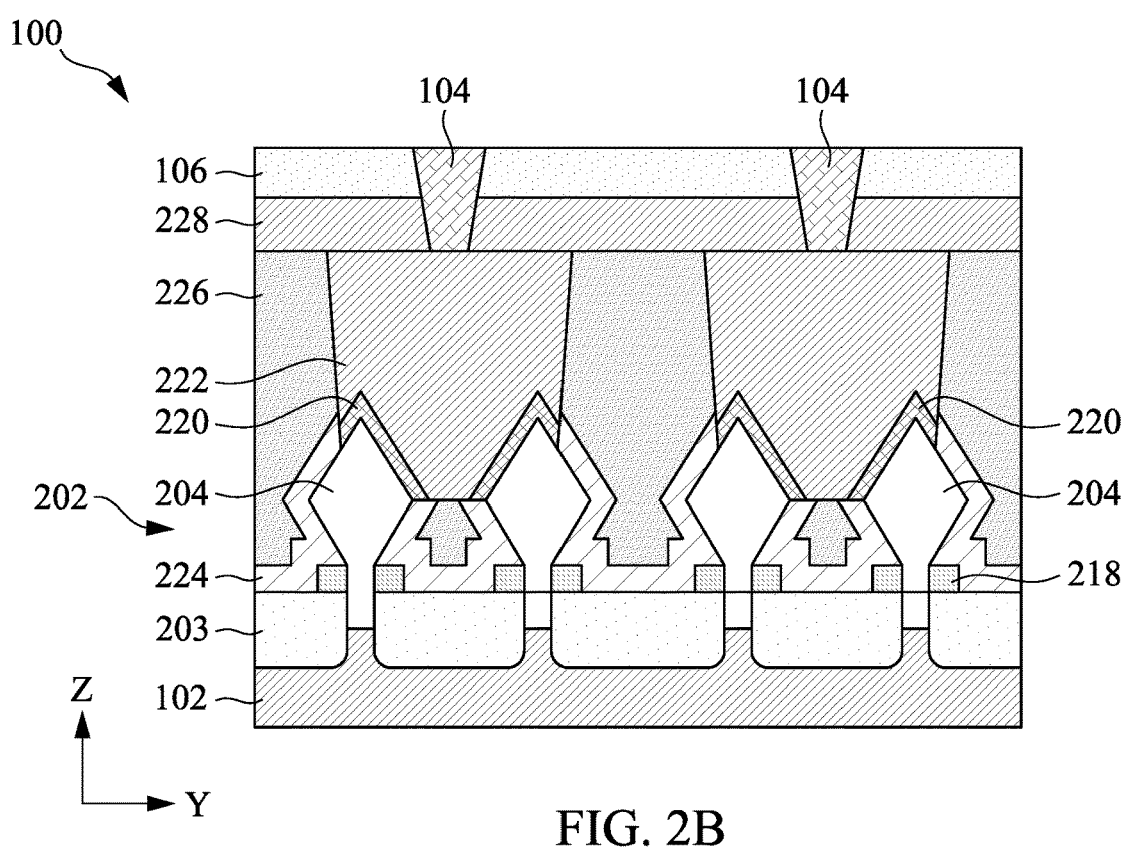

FIGS. 2A-18A are cross-sectional side views of various stages of manufacturing the semiconductor device structure 100 taken along line A-A of FIG. 1, in accordance with some embodiments. FIGS. 2B-18B are cross-sectional side views of various stages of manufacturing the semiconductor device structure 100 taken along line B-B of FIG. 1, in accordance with some embodiments. FIG. 2A is a cross-sectional side view of the semiconductor device structure 100 taken along line A-A of FIG. 1, and FIG. 2B is a cross-sectional side view of the semiconductor device structure 100 taken along line B-B of FIG. 1. The line A-A of FIG. 1 extends along a direction that is substantially perpendicular to the longitudinal direction of a gate stack 206, and the line B-B of FIG. 1 extends along the longitudinal direction of the gate stack 206. As shown in FIGS. 2A and 2B, the semiconductor device structure 100 includes the substrate 102, one or more devices 202 formed on the substrate 102, the dielectric material 106 formed over the devices 202, and the conductive features 104 formed in the dielectric material 106. The substrate 102 may be a semiconductor substrate. In some embodiments, the substrate 102 includes a single crystalline semiconductor layer on at least the surface of the substrate 102. The substrate 102 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). For example, the substrate 102 is made of Si. In some embodiments, the substrate 102 is a silicon-on-insulator (SOI) substrate, which includes an insulating layer (not shown) disposed between two silicon layers. In one aspect, the insulating layer is an oxygen-containing material, such as an oxide.

The substrate 102 may include one or more buffer layers (not shown) on the surface of the substrate 102. The buffer layers can serve to gradually change the lattice constant from that of the substrate to that of the source/drain regions. The buffer layers may be formed from epitaxially grown single crystalline semiconductor materials such as, but not limited to Si, Ge, germanium tin (GeSn), SiGe, GaAs, InSb, GaP, GaSb, InAlAs, InGaAs, GaSbP, GaAsSb, GaN, GaP, and InP. In one embodiment, the substrate 102 includes SiGe buffer layers epitaxially grown on the silicon substrate 102. The germanium concentration of the SiGe buffer layers may increase from 30 atomic percent germanium for the bottom-most buffer layer to 70 atomic percent germanium for the top-most buffer layer.

The substrate 102 may include various regions that have been suitably doped with impurities (e.g., p-type or n-type impurities). The dopants are, for example boron for an n-type fin field effect transistor (FinFET) and phosphorus for a p-type FinFET.

As described above, the devices 202 may be any suitable devices, such as transistors, diodes, imaging sensors, resistors, capacitors, inductors, memory cells, or a combination thereof. In some embodiments, the devices 202 are transistors, such as planar field effect transistors (FETs), FinFETs, nanosheet transistors, or other suitable transistors. The nanosheet transistors may include nanowire transistors, gate-all-around (GAA) transistors, multi-bridge channel (MBC) transistors, or any transistors having the gate electrode surrounding the channels. An example of the device 202 formed between the substrate 102 and the conductive features 104 is a FinFET, which is shown in FIGS. 2A and 2B. The device 202 includes source/drain (S/D) regions 204 and gate stacks 206. Each gate stack 206 may be disposed between S/D regions 204 serving as source regions and S/D regions 204 serving as drain regions. For example, each gate stack 206 may extend along the Y-axis between a plurality of S/D regions 204 serving as source regions and a plurality of S/D regions 204 serving as drain regions. As shown in FIG. 2A, two gate stacks 206 are formed on the substrate 102. In some embodiments, more than two gate stacks 206 are formed on the substrate 102. Channel regions 208 are formed between S/D regions 204 serving as source regions and S/D regions 204 serving as drain regions.

The S/D regions 204 may include a semiconductor material, such as Si or Ge, a III-V compound semiconductor, a II-VI compound semiconductor, or other suitable semiconductor material. Exemplary S/D region 204 may include, but are not limited to, Ge, SiGe, GaAs, AlGaAs, GaAsP, SiP, InAs, AlAs, InP, GaN, InGaAs, InAlAs, GaSb, AlP, GaP, and the like. The S/D regions 204 may include p-type dopants, such as boron; n-type dopants, such as phosphorus or arsenic; and/or other suitable dopants including combinations thereof. The S/D regions 204 may be formed by an epitaxial growth method using CVD, atomic layer deposition (ALD) or molecular beam epitaxy (MBE). The channel regions 208 may include one or more semiconductor materials, such as Si, Ge, GeSn, SiGe, GaAs, InSb, GaP, GaSb, InAlAs, InGaAs, GaSbP, GaAsSb, GaN, GaP, or InP. In some embodiments, the channel regions 208 include the same semiconductor material as the substrate 102. In some embodiments, the devices 202 are FinFETs, and the channel regions 208 are a plurality of fins disposed below the gate stacks 206. In some embodiments, the devices 202 are nanosheet transistors, and the channel regions 208 are surrounded by the gate stacks 206.

Each gate stack 206 includes a gate electrode layer 210 disposed over the channel region 208 (or surrounding the channel region 208 for nanosheet transistors). The gate electrode layer 210 may be a metal-containing material such as tungsten, cobalt, aluminum, ruthenium, copper, multilayers thereof, or the like, and can be deposited by ALD, plasma enhanced chemical vapor deposition (PECVD), MBD, physical vapor deposition (PVD), or any suitable deposition technique. Each gate stack 206 may include an interfacial dielectric layer 212, a gate dielectric layer 214 disposed on the interfacial dielectric layer 212, and one or more conformal layers 216 disposed on the gate dielectric layer 214. The gate electrode layer 210 may be disposed on the one or more conformal layers 216. The interfacial dielectric layer 212 may include a dielectric material, such as an oxygen-containing material or a nitrogen-containing material, or multilayers thereof, and may be formed by any suitable deposition method, such as CVD, PECVD, or ALD. The gate dielectric layer 214 may include a dielectric material such as an oxygen-containing material or a nitrogen-containing material, a high-k dielectric material having a k value greater than about 7.0, or multilayers thereof. The gate dielectric layer 214 may be formed by any suitable method, such as CVD, PECVD, or ALD. The one or more conformal layers 216 may include one or more barrier layers and/or capping layers, such as a nitrogen-containing material, for example tantalum nitride (TaN), titanium nitride (TiN), or the like. The one or more conformal layers 216 may further include one or more work-function layers, such as aluminum titanium carbide, aluminum titanium oxide, aluminum titanium nitride, or the like. The term "conformal" may be used herein for ease of description upon a layer having substantial same thickness over various regions. The one or more conformal layers 216 may be deposited by ALD, PECVD, MBD, or any suitable deposition technique.

Gate spacers 218 are formed along sidewalls of the gate stacks 206 (e.g., sidewalls of the gate dielectric layers 214). The gate spacers 218 may include silicon oxycarbide, silicon nitride, silicon oxynitride, silicon carbon nitride, the like, multi-layers thereof, or a combination thereof, and may be deposited by CVD, ALD, or other suitable deposition technique.

Portions of the gate stacks 206 and the gate spacers 218 may be formed on isolation regions 203. The isolation regions 203 are formed on the substrate 102. The isolation regions 203 may include an insulating material such as an oxygen-containing material, a nitrogen-containing material, or a combination thereof. The insulating material may be formed by a high-density plasma chemical vapor deposition (HDP-CVD), a flowable chemical vapor deposition (FCVD), or other suitable deposition process. In one aspect, the isolation regions 203 includes silicon oxide that is formed by a FCVD process.

A contact etch stop layer (CESL) 224 is formed on a portion of the S/D regions 204 and the isolation region 203, and a first interlayer dielectric (ILD) 226 is formed on the CESL 224. The CESL 224 can provide a mechanism to stop an etch process when forming openings in the first ILD 226. The CESL 224 may be conformally deposited on surfaces of the S/D regions 204 and the isolation regions 203. The CESL 224 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be deposited by CVD, PECVD, ALD, or any suitable deposition technique. The first ILD 226 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), organosilicate glass (OSG), SiOC, and/or any suitable low-k dielectric materials (e.g., a material having a dielectric constant lower than silicon dioxide), and may be deposited by spin-on, CVD, FCVD, PECVD, PVD, or any suitable deposition technique.

A silicide layer 220 is formed on at least a portion of each S/D region 204, as shown in FIGS. 2A and 2B. The silicide layer 220 may include a material having one or more of WSi, CoSi, NiSi, TiSi, MoSi and TaSi. In some embodiments, the silicide layer 220 includes a metal or metal alloy silicide, and the metal includes a noble metal, a refractory metal, a rare earth metal, alloys thereof, or combinations thereof. A conductive contact 222 is disposed on each silicide layer 220. The conductive contact 222 may include a material having one or more of Ru, Mo, Co, Ni. W, Ti, Ta, Cu, Al, TiN or TaN, and the conductive contact 222 may be formed by any suitable method, such as electro-chemical plating (ECP) or PVD. The silicide layer 220 and the conductive contact 222 may be formed by first forming an opening in the first ILD 226 and the CESL 224 to expose at least a portion of the S/D region 204, then forming the silicide layer 220 on the exposed portion of the S/D region 204, and then forming the conductive contact 222 on the silicide layer 220.

An etch stop layer 228 may be formed over the devices 202, as shown in FIGS. 2A and 2B. The etch stop layer 228 may include the same material as the CESL 224 and may be deposited by the same process as that for the CESL 224. The dielectric material 106 is formed on the etch stop layer 228. The dielectric material 106 may be another etch stop layer. The dielectric material 106 may include the same material as the etch stop layer 228 and may be deposited by the same process as that for the etch stop layer 228. The conductive features 104 are formed in the etch stop layer 228 and the dielectric material 106, and each conductive feature 104 may be in contact with a corresponding conductive contact 222.

Figure 3A:
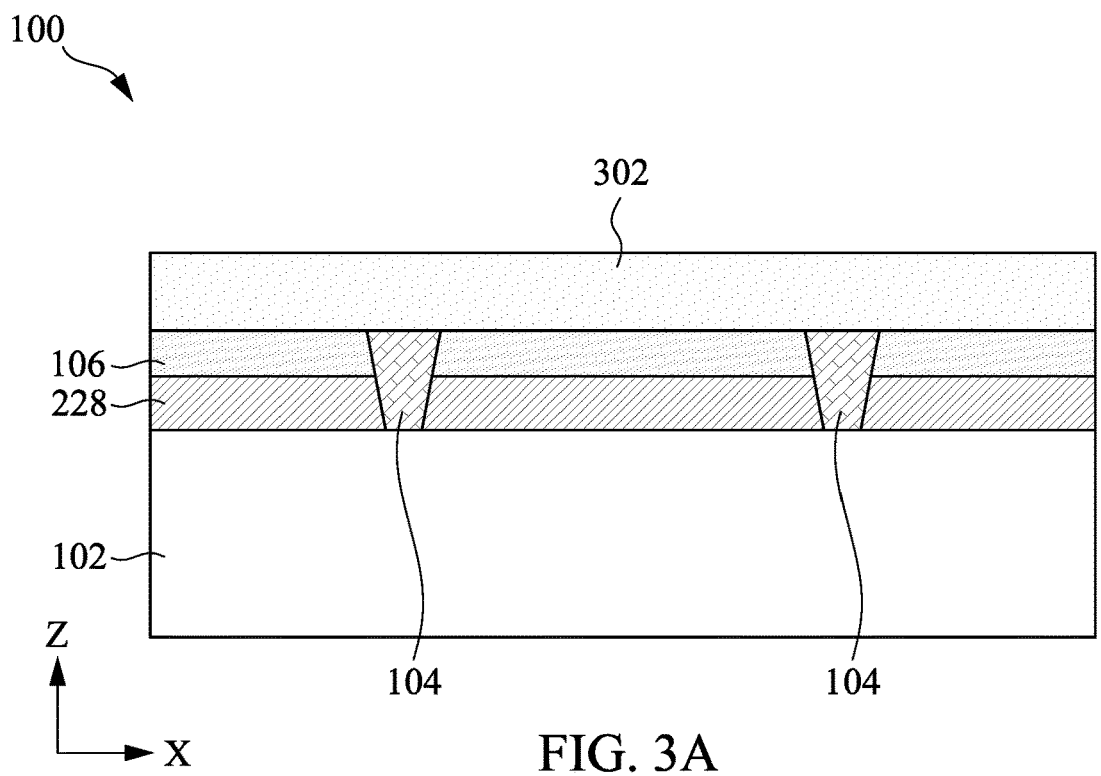
Figure 3B:
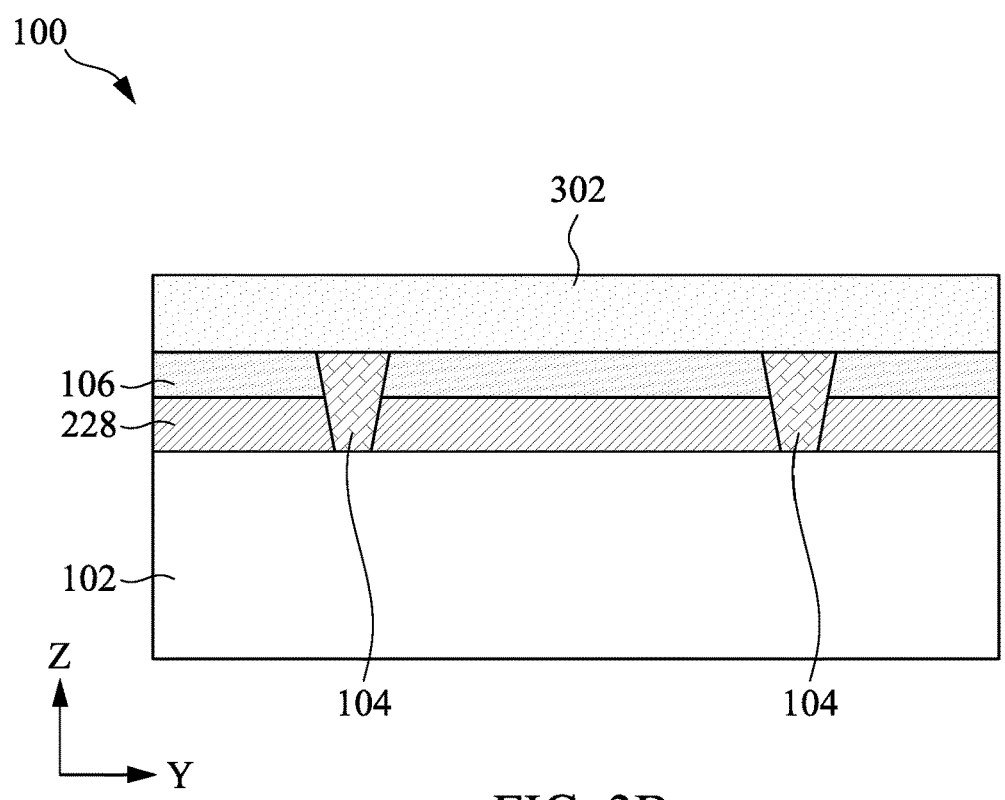

Next, as shown in FIGS. 3A and 3B, a dielectric material 302 is formed on the dielectric material 106 and the plurality of conductive features 104. The devices 202 (FIGS. 2A and 2B) and other features formed on the substrate 102 are omitted for clarity. The dielectric material 302 may be a second ILD layer. The dielectric material 302 may include SiC, LaO, AlO, AlON, ZrO, HfO, SiN, ZnO, ZrN, ZrAlO, TiO, TaO, YO, TaCN, ZrSi, SiOCN, SiOC, SiCN, HfSi, or SiO. In some embodiments, the dielectric material 302 may have a thickness ranging from about 1 nanometer (nm) to about 40 nm. If the thickness of the dielectric material 302 is greater than about 40 nm, the manufacturing cost is increased without significant advantage. On the other hand, if the thickness of the dielectric material 302 is less than about 1 nm, the dielectric material 302 may be insufficient to isolate any conductive features formed therebelow from the conductive features formed thereon. The dielectric material 302 may be formed by any suitable method, such as CVD or PECVD.

Figure 4A:
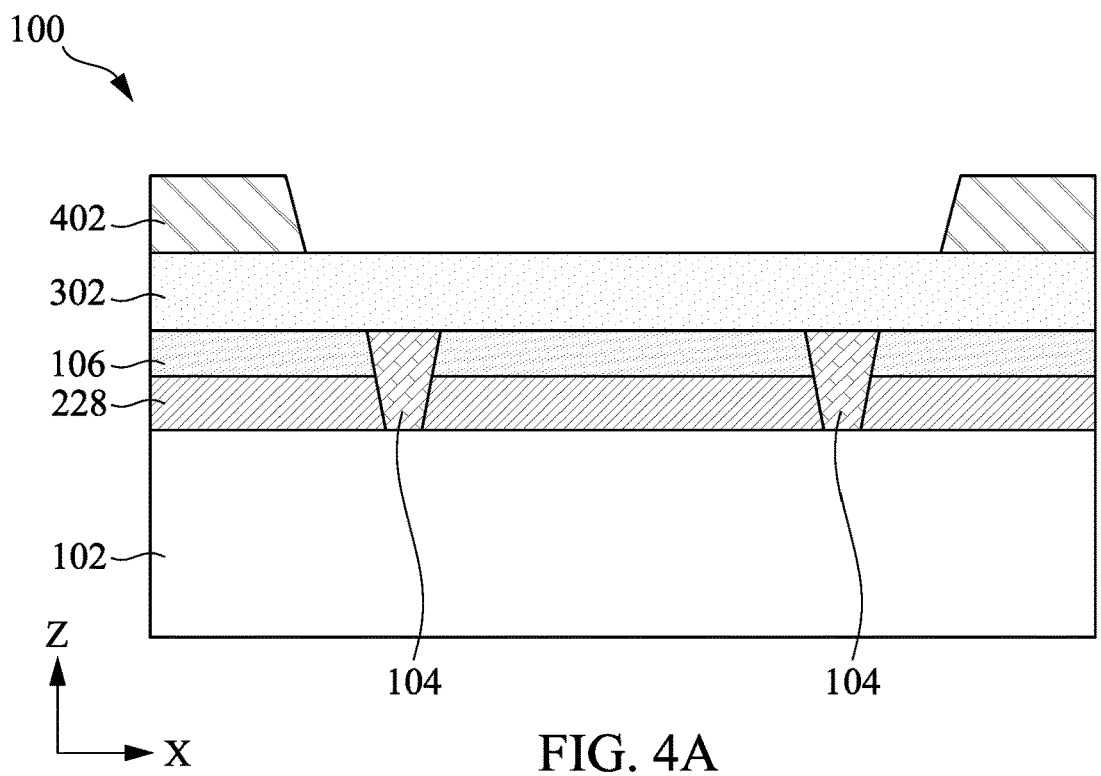
Figure 4B:
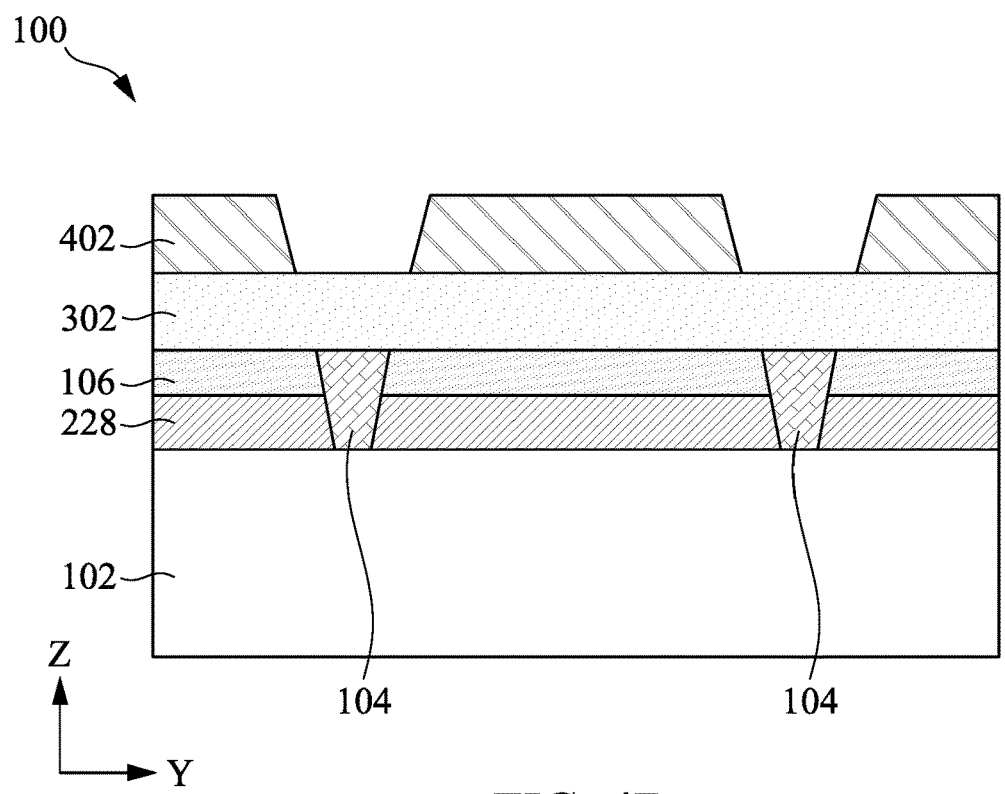

Next, as shown in FIGS. 4A and 4B, a mask layer 402 is formed on portions of the dielectric material 302. The mask layer 402 may be formed by first forming a layer on the dielectric material 302. The layer may include an oxygen-containing material or a nitrogen-containing material, such as a silicon oxide layer, a silicon nitride layer, a silicon oxynitride layer, or combinations thereof. The layer may be patterned and etched to form the mask layer 402. The patterning process may include a photolithography process that may include forming a photoresist layer (not shown) over the layer, exposing the resist to a pattern, performing post-exposure bake processes, and developing the resist. In some embodiments, patterning the resist may be performed using a lithography process, such as an electron beam (e-beam) lithography process, an extreme ultraviolet lithography process, or the like. The pattern of the resist is transferred to the layer using one or more etching processes to form the mask layer 402. In some embodiments, the etching process may include dry etching (e.g., reactive ion etching (RIE)), wet etching, other etching methods, and/or combinations thereof.

Figure 5A:
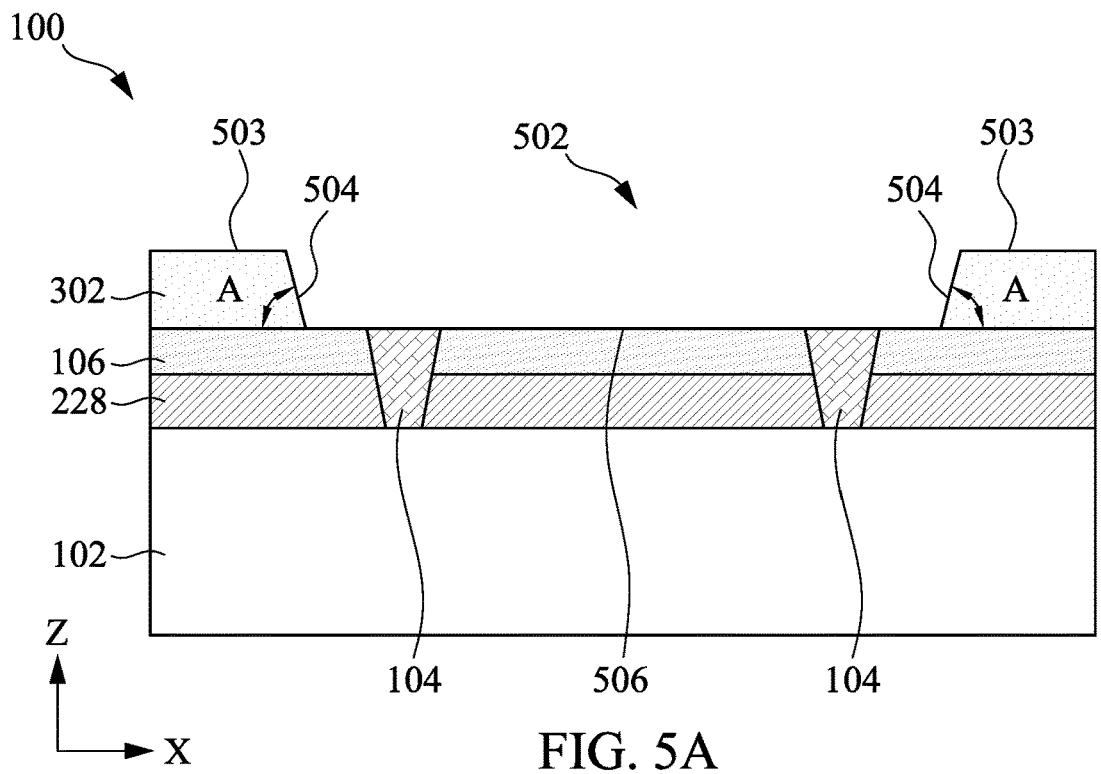
Figure 5B:
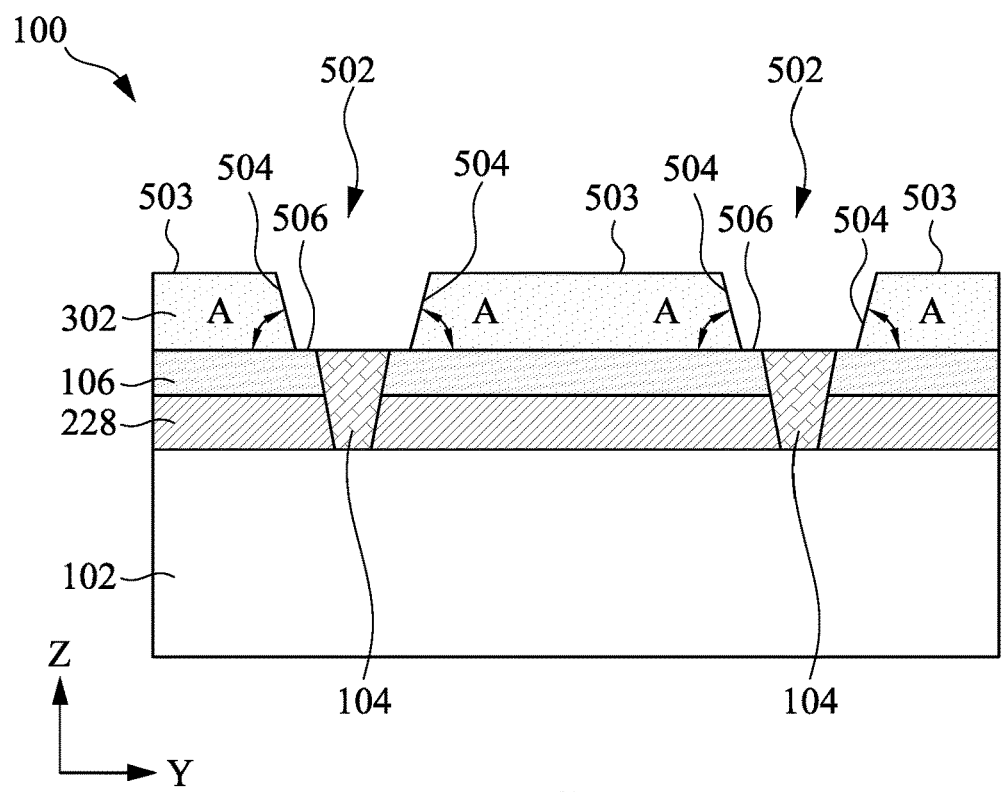

The pattern of the mask layer 402 is transferred to the dielectric material 302 by removing portions of the dielectric material 302 not covered by the mask layer 402, as shown in FIGS. 5A and 5B. The removal of portions of the dielectric material 302 may be performed by any suitable method, such as dry etching, wet etching, or a combination thereof. The mask layer 402 is then removed. The remaining dielectric material 302 has a top surface 503 and sidewalls 504. Openings 502 are formed as the result of the removal of the portions of the dielectric material 302. Each opening 502 may be defined by the corresponding sidewall 504. In some embodiments, openings 502 are trenches, and the sidewall 504 defining each trench includes multiple surfaces, such as 4 surfaces, as shown in FIGS. 5A and 5B. In some embodiments, openings 502 are vias, and the sidewall 504 defining each via is a continuous surface. The sidewall 504 may form an acute angle A with respect to a top surface 506 of the dielectric material 106 as a result of the etching process. The acute angle A may range from about 60 degrees to about 89.5 degrees. In the embodiment where the sidewall 504 includes multiple surfaces, each surface may form the acute angle A with respect to the top surface 506 of the dielectric material 106, the acute angles A of the surfaces of the sidewall 504 may be substantially the same or different.

As shown in FIGS. 5A and 5B, the openings 502 expose the conductive features 104 and portions of the top surface 506 of the dielectric material 106. In some embodiments, when the conductive features 104 are not present in the etch stop layer 228 and the dielectric material 106, portions of the dielectric material 106 and the etch stop layer 228 not covered by the dielectric material 302 are removed to expose the conductive contacts 222 and portions of the first ILD 226 (FIGS. 2A and 2B). The removal of the portions of the dielectric material 106 and the etch stop layer 228 may be performed by the same process as the removal of the portion of the dielectric material 302 or by a separate process as the removal of the portion of the dielectric material 302. As shown in FIG. 5A, 2 conductive features 104 are exposed along the X-axis. In some embodiments, more than 2 conductive features 104, such as more than 5 or more than 10 conductive features 104 are exposed. In the embodiment where the conductive features 104 are not present, more than 2 conductive contacts 222 (FIGS. 2A and 2B), such as more than 5 or more than 10 conductive contacts 222, are exposed.

Figure 6A:
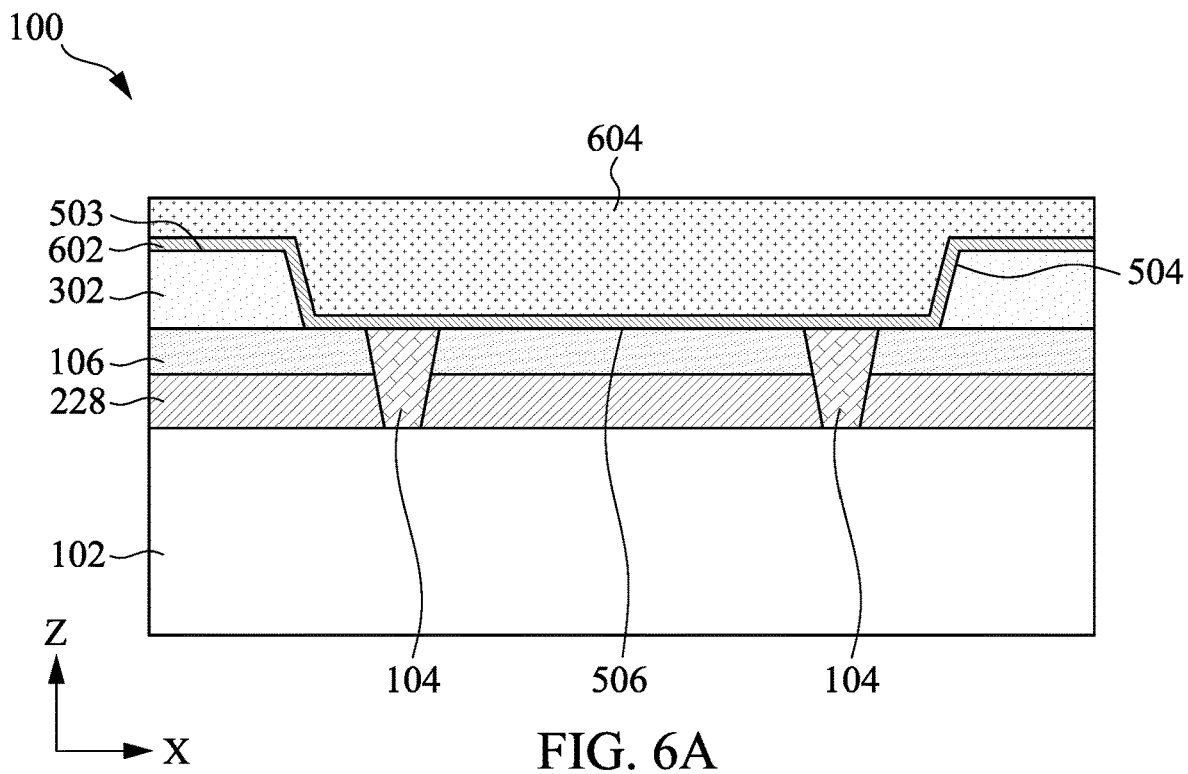
Figure 6B:
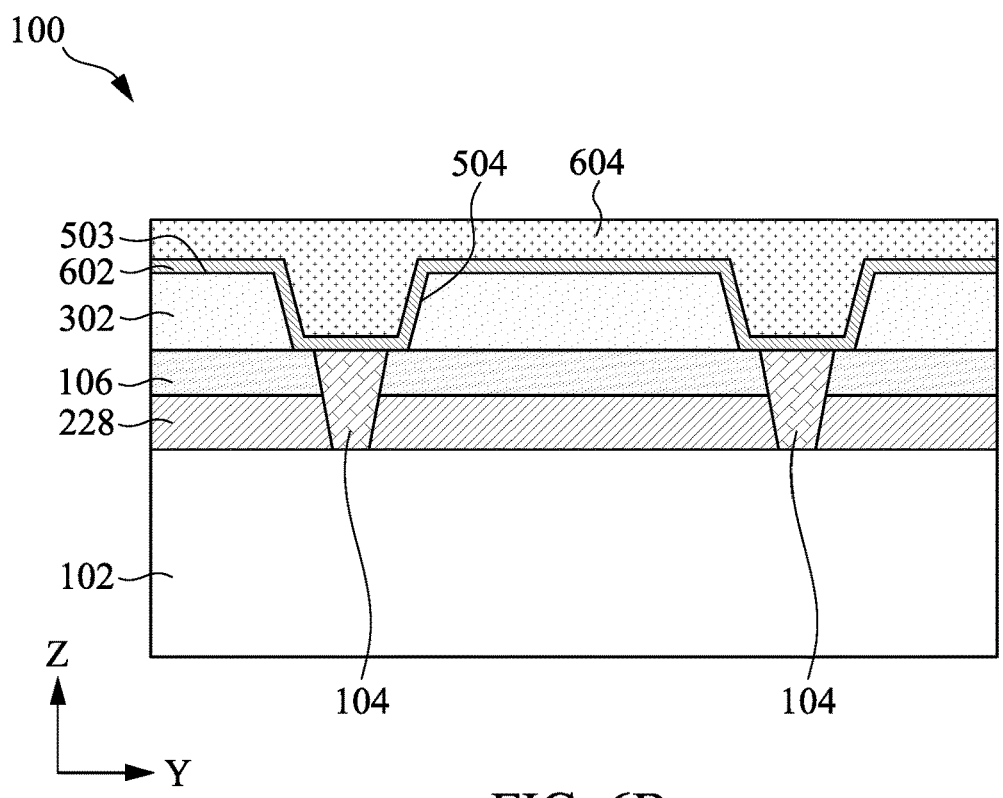

A first barrier layer 602 is formed on the top surfaces 503 of the dielectric material 302, the sidewalls 504 of the dielectric material 302, the exposed portions of the top surface 506 of the dielectric material 106, and the conductive features 104, as shown in FIGS. 6A and 6B. The first barrier layer 602 may include Co, W, Ru, Al, Mo, Ti, TiN, TiSi, CoSi, NiSi, Cu, TaN, Ni, or TiSiNi. The first barrier layer 602 may be a single layer or a multilayer structure, such as a two-layer structure or a three-layer structure. In some embodiments, the first barrier layer 602 may be conformally deposited and may have a thickness ranging from about 0.5 nm to about 10 nm. The first barrier layer 602 functions as a diffusion barrier layer to prevent a first conductive material 604 from diffusing into the dielectric material 106 and the dielectric material 302. Thus, if the thickness of the first barrier layer 602 is less than about 0.5 nm, the first barrier layer 602 may not be sufficient to prevent the diffusion of the first conductive material 604 into the dielectric material 106 and the dielectric material 302. On the other hand, if the thickness of the first barrier layer 602 is greater than about 10 nm, the manufacturing cost is increased without significant advantage. The first barrier layer 602 may be formed by any suitable method, such as ALD, CVD or PECVD.

The first conductive material 604 is formed on the first barrier layer 602, as shown in FIGS. 6A and 6B. The first conductive material 604 may include Co, W, Ru, Al, Mo, Ti, TiN, TiSi, CoSi, NiSi, Cu, TaN, Ni, or TiSiNi. The first conductive material 604 may include the same or different material as the first barrier layer 602. In some embodiments, the first barrier layer 602 is not present, and the first conductive material 604 is formed on the top surface 503 of the dielectric material 302, the sidewalls 504 of the dielectric material 302, the exposed portions of the top surface 506 of the dielectric material 106, and the conductive features 104.

Figure 7A:
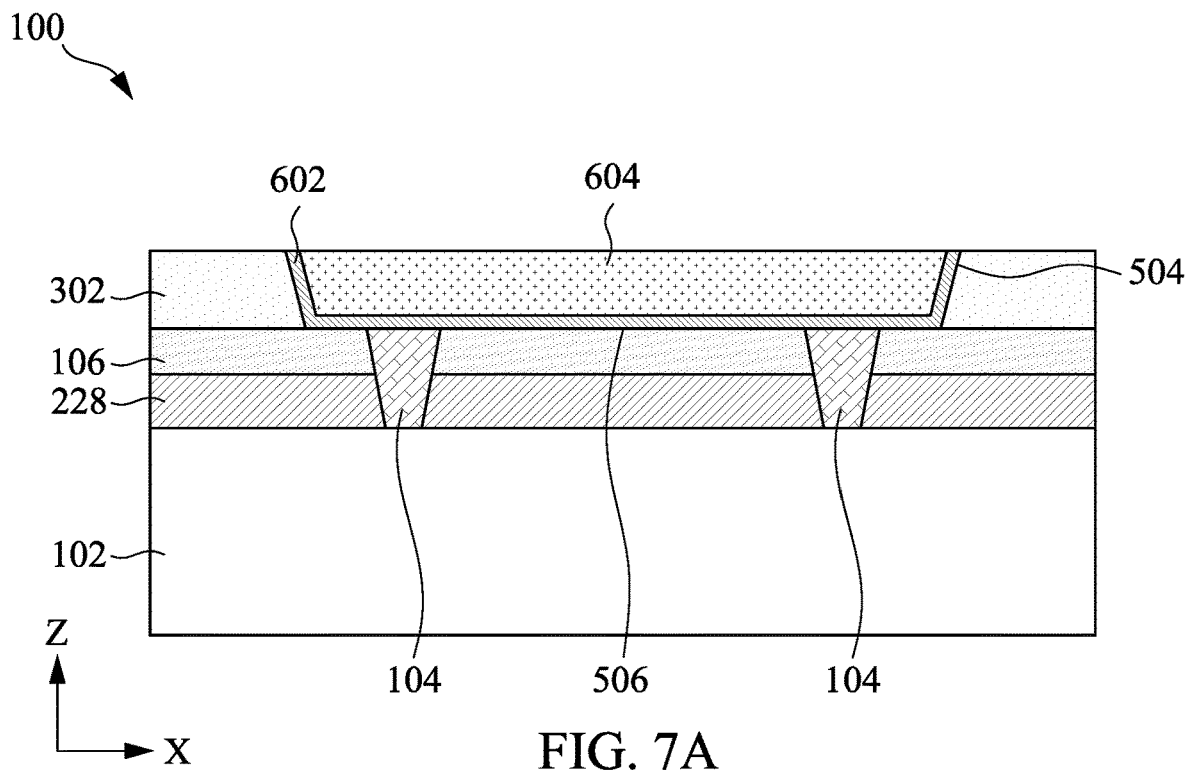
Figure 7B:
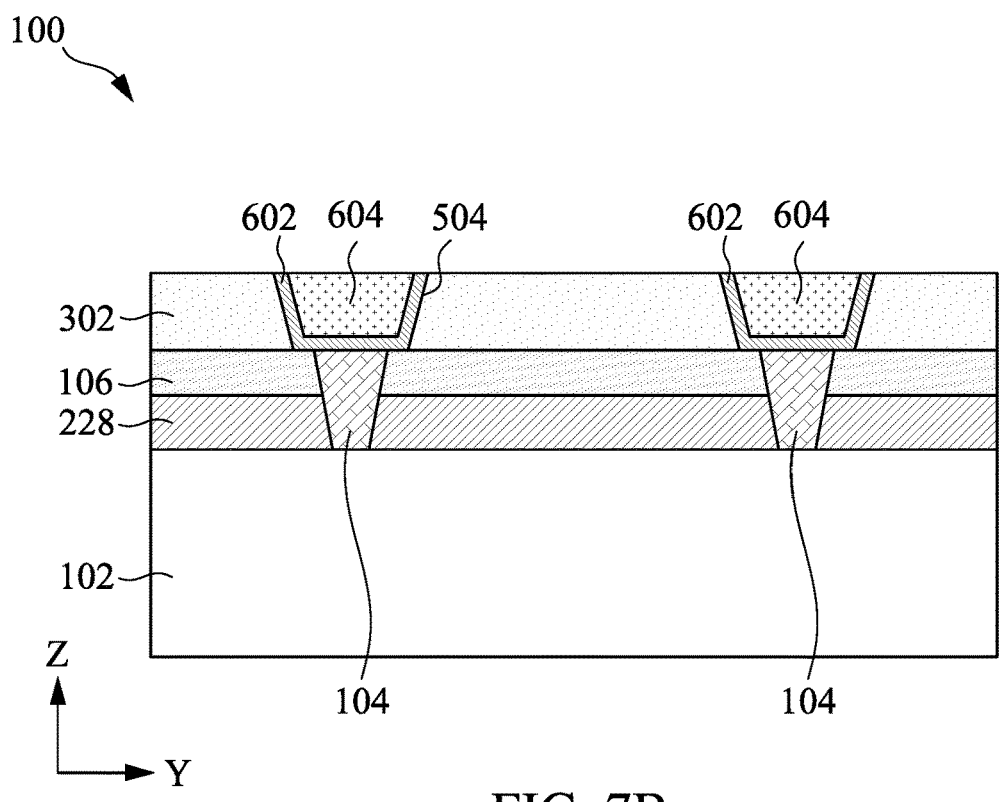

Next, as shown in FIGS. 7A and 7B, a planarization process is performed to expose the dielectric material 302. The planarization process may be any suitable process, such as a chemical mechanical polishing (CMP) process. The planarization process removes portions of the first conductive material 604 and portions of the first barrier layer 602 so the first conductive material 604 is substantially coplanar with the dielectric material 302.

Figure 8A:
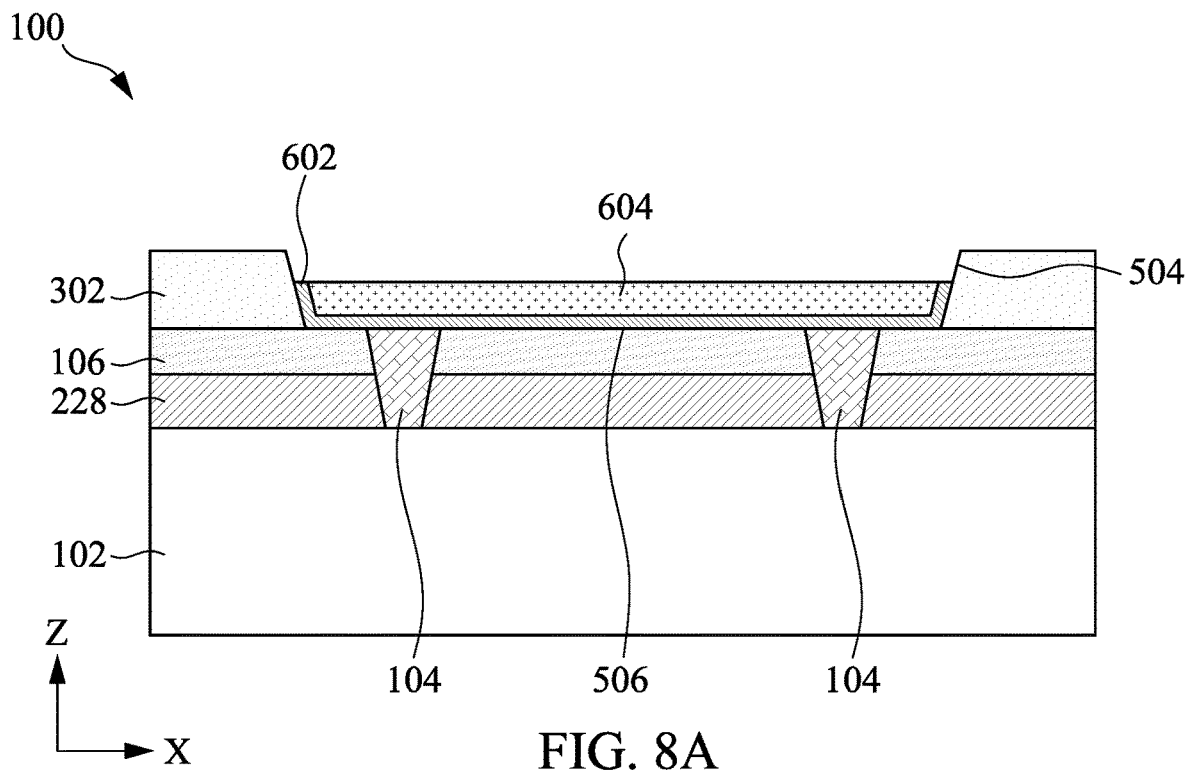
Figure 8B:
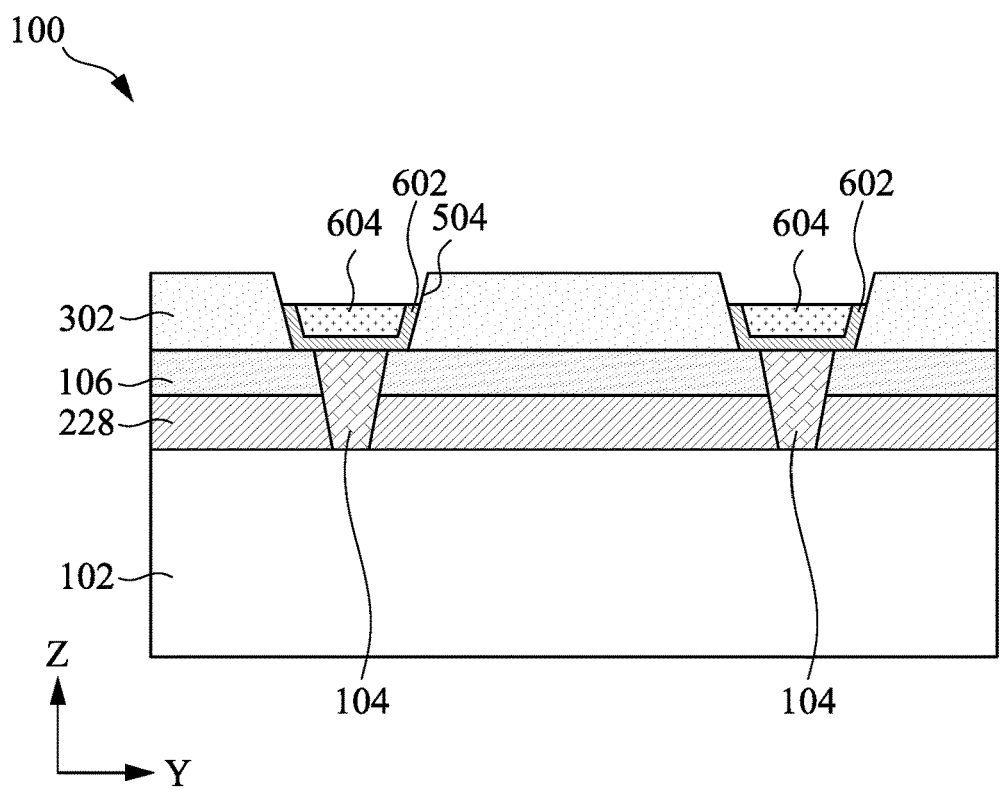

In some embodiments, the first barrier layer 602 and the first conductive material 604 are etched back, as shown in FIGS. 8A and 8B. Portions of the first barrier layer 602 disposed on the sidewall 504 are removed to expose a portion of the sidewall 504. The thickness of the first conductive material 604 is reduced, so the openings 502 are partially filled. The etch back of the first barrier layer 602 and the first conductive material 604 may be performed by any suitable method, such as dry etching, wet etching, or a combination thereof. In some embodiments, a selective dry etching process is utilized to perform the etch back. The selective dry etching process selectively removes portions of the first barrier layer 602 and the first conductive material 604, while the dielectric material 302 is not removed.

Figure 9A:
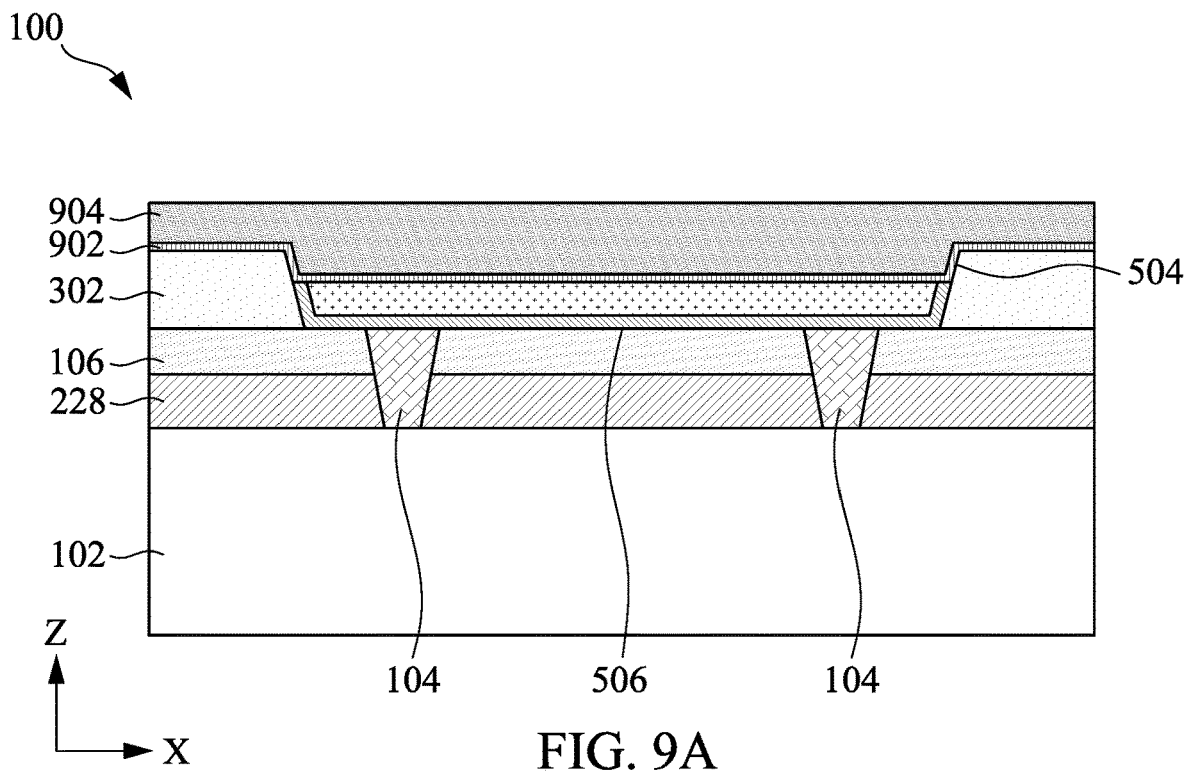
Figure 9B:
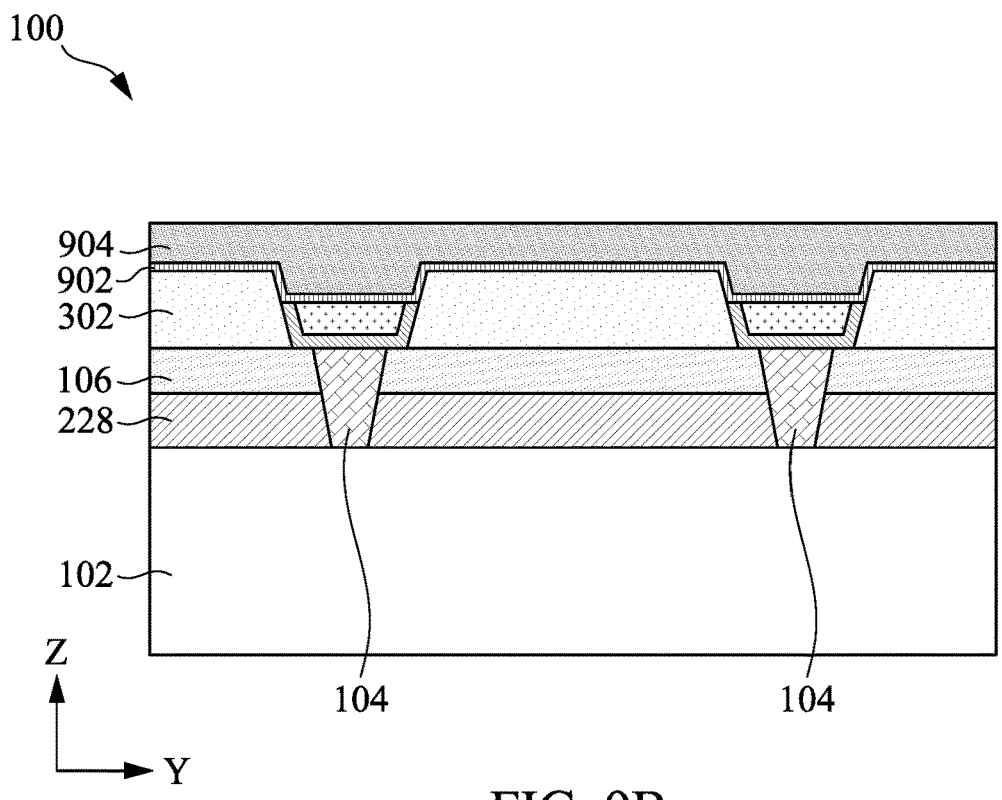

Next, as shown in FIGS. 9A and 9B, a second barrier layer 902 is formed on the dielectric material 302, the exposed portion of the sidewall 504, the first barrier layer 602, and the first conductive material 604. The second barrier layer 902 may include Co, W, Ru, Al, Mo, Ti, TiN, TiSi, CoSi, NiSi, Cu, TaN, Ni, or TiSiNi. The second barrier layer 902 may be a single layer or a multilayer structure, such as a two-layer structure or a three-layer structure. In some embodiments, the second barrier layer 902 may be conformally deposited and may have a thickness ranging from about 0.5 nm to about 10 nm. The second barrier layer 902 functions as a diffusion barrier layer to prevent a second conductive material 904 from diffusing into the dielectric material 302. Thus, if the thickness of the second barrier layer 902 is less than about 0.5 nm, the second barrier layer 902 may not be sufficient to prevent the diffusion of the conductive material 904 into the dielectric material 302. On the other hand, if the thickness of the second barrier layer 902 is greater than about 10 nm, the manufacturing cost is increased without significant advantage. The second barrier layer 902 may be formed by any suitable method, such as ALD, CVD or PECVD.

The second conductive material 904 is formed on the second barrier layer 902, as shown in FIGS. 9A and 9B. The second conductive material 904 may include Co, W, Ru, Al, Mo, Ti, TiN, TiSi, CoSi, NiSi, Cu, TaN, Ni, or TiSiNi. The second conductive material 904 may include the same or different material as the second barrier layer 902. In some embodiments, the second barrier layer 902 is not present, and the second conductive material 904 is formed on the dielectric material 302, the exposed portion of the sidewall 504, the first barrier layer 602, and the first conductive material 604.

In some embodiments, the first conductive material 604 is a metal having a low electrical resistivity, such as copper, and the first conductive material 604 fills the openings 502 without the second conductive material 904 (the second conductive material 904 and the second barrier layer 902 are not present). However, as the dimensions of features get smaller, materials such as copper may not have good step coverage in the openings 502. Thus, in some embodiments, a conductive material having good step coverage in the openings 502 may be utilized as the first conductive material 604, and a conductive material having low electrical resistivity may be utilized as the second conductive material 904. The bottom of the opening 502 has a smaller dimension than the top of the opening 502, thus, the first conductive material 604 having good step coverage is formed at the bottom of the opening 502 and the second conductive material 904 having low electrical resistivity is formed at the top of the opening 502. For example, the first conductive material 604 is TiN and the second conductive material 904 is Cu. In some embodiments, the thickness of the first conductive material 604 ranges from about 0.5 nm to about 40 nm, and the thickness of the second conductive material 904 ranges from about 0.5 nm to about 38 nm. In some embodiments, the second conductive material 904 does not exist. The thicknesses of the first conductive material 604 and the second conductive material 904 may be defined by the thickness of the dielectric material 302.

Figure 10A:
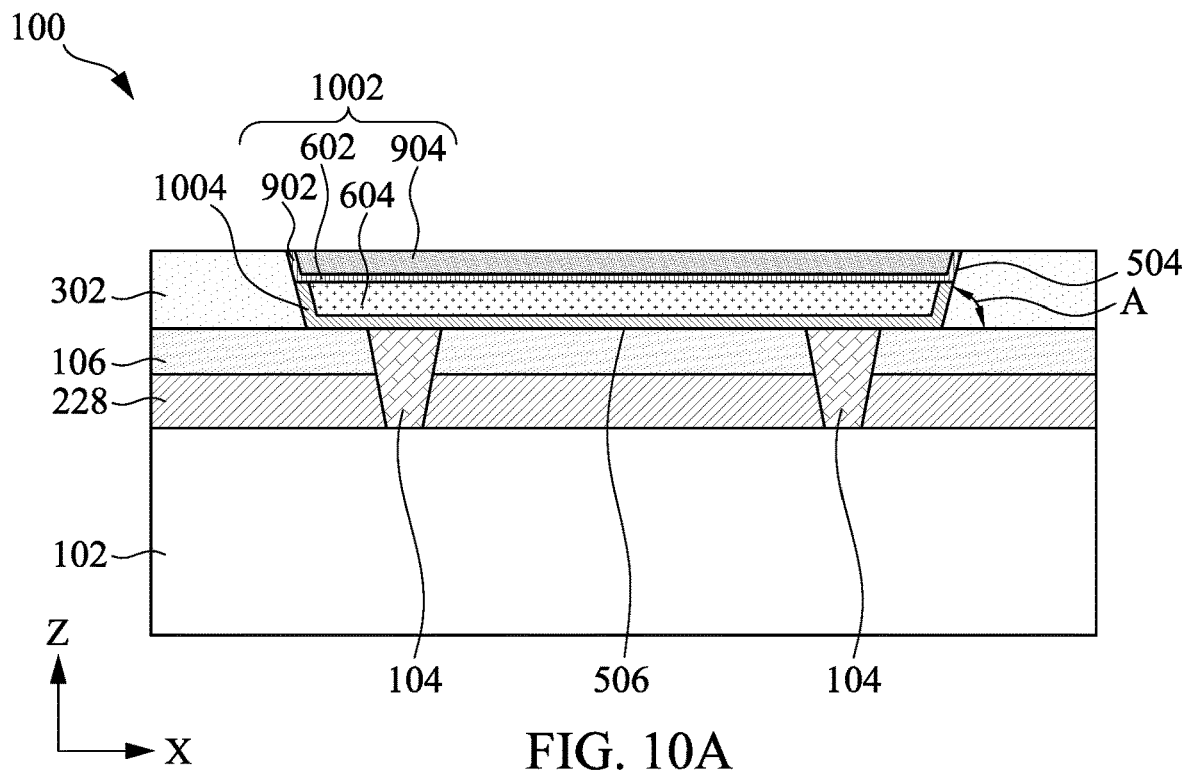
Figure 10B:
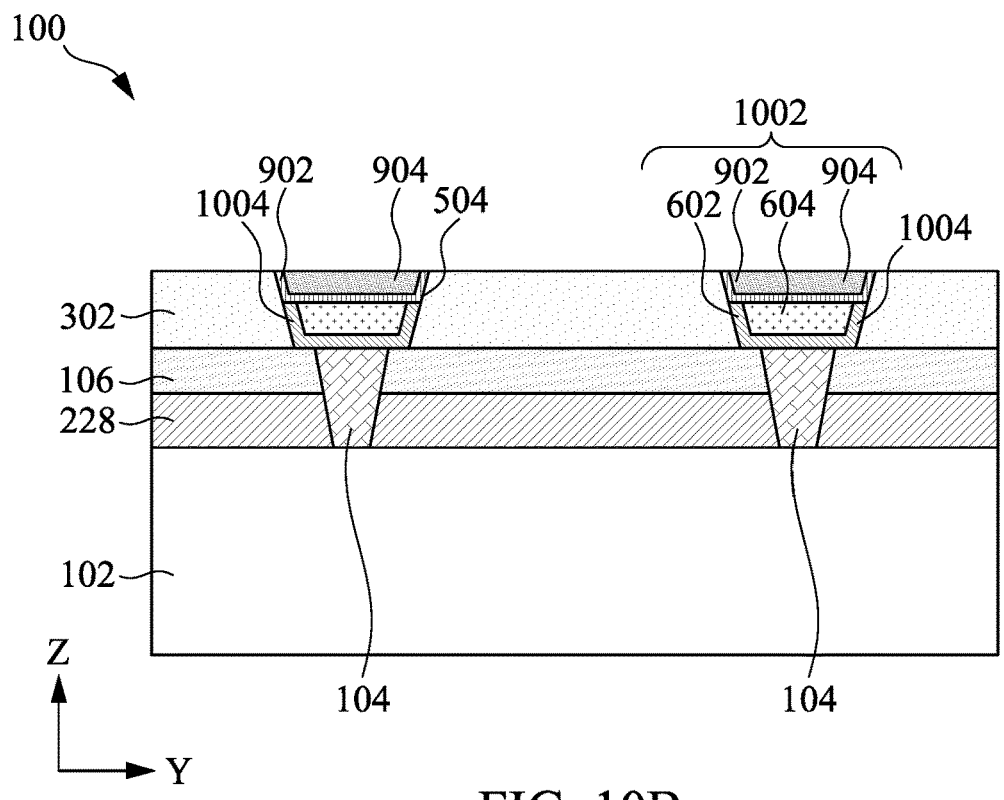

Next, as shown in FIGS. 10A and 10B, a planarization process is performed to expose the dielectric material 302. The planarization process may be any suitable process, such as a CMP process. The planarization process removes portions of the second conductive material 904 and portions of the second barrier layer 902 so the second conductive material 904 is substantially coplanar with the dielectric material 302. The first barrier layer 602, the first conductive material 604, the second barrier layer 902, and the second conductive material 904 may be collectively referred to as a conductive structure 1002. The conductive structure 1002 may be a conductive contact, a conductive line, or a conductive via. In some embodiments, the conductive structure 1002 includes the first conductive material 604 and optionally the first barrier layer 602, while the second barrier layer 902 and the second conductive material 904 are not present. The conductive structure 1002 includes a sidewall 1004 in contact with the sidewall 504 of the dielectric material 302. Because the sidewall 1004 is in contact with the sidewall 504 of the dielectric material 302, the sidewall 1004 also forms the acute angel A with respect to the top surface 506 of the dielectric material 106. The sidewall 1004 of the conductive structure 1002 may include one or more of the first barrier layer 602, first conductive material 604, second barrier layer 902, and second conductive material 904. For example, in some embodiments, the sidewall 1004 includes the first barrier layer 602 and the second barrier layer 902, as shown in FIGS. 10A and 10B. The sidewall 1004 of the conductive structure 1002 may include multiple surfaces or a continuous surface, based on the shape of the conductive structure 1002. In some embodiments, the conductive structure 1002 is a conductive line, and the sidewall 1004 of the conductive line includes multiple surfaces, such as 4 surfaces, as shown in FIGS. 10A and 10B. In some embodiments, the conductive structure 1002 is a conductive via, and the sidewall 1004 of the conductive via is a continuous surface.

Figure 11A:
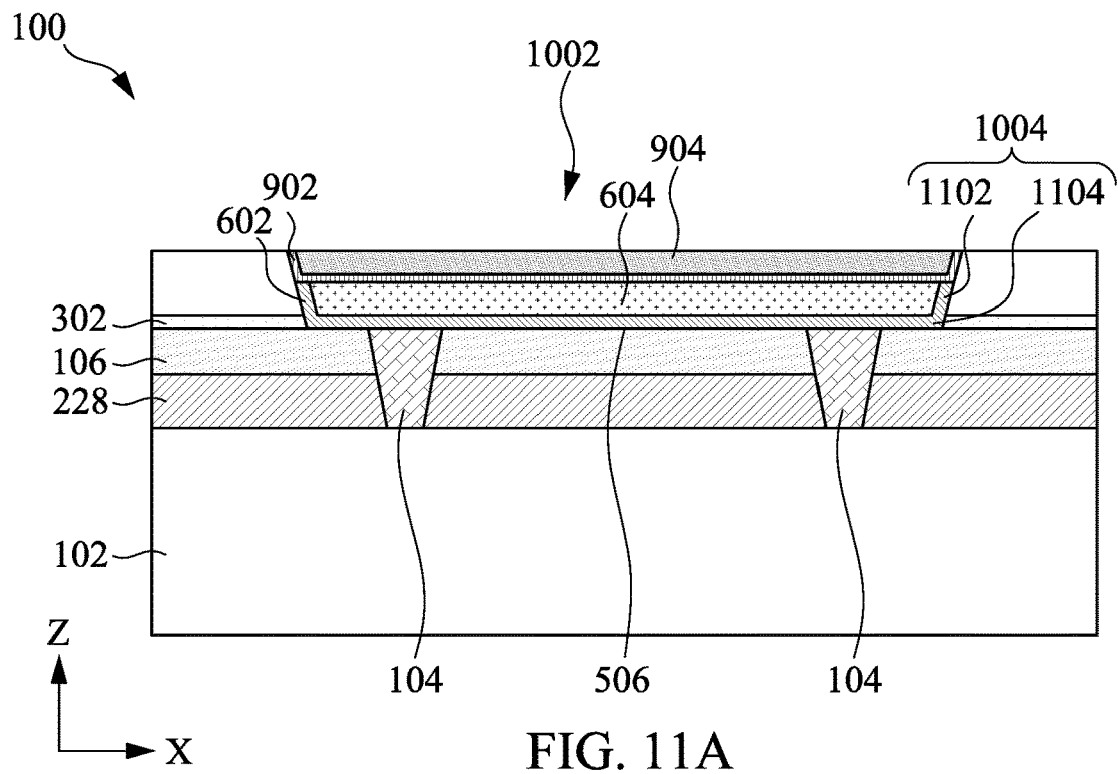
Figure 11B:
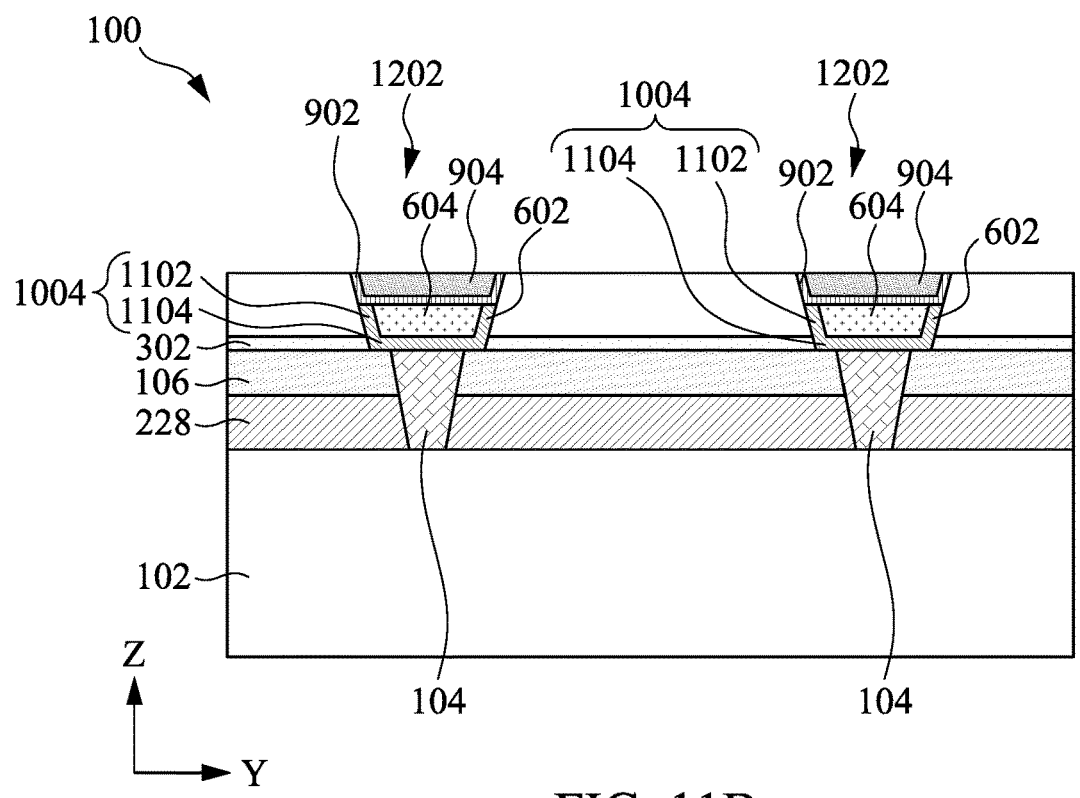

In some embodiments, the dielectric material 302 is etched back, as shown in FIGS. 11A and 11B. The thickness of the dielectric material 302 is reduced to a range from about 1 nm to about 20 nm, and a first portion 1102 of the sidewall 1004 of the conductive structure 1002 is exposed. The thickness of the dielectric material 302 is reduced, so an air gap 1802 (FIGS. 18A and 18B) can be formed to surround the first portion 1102 of the sidewall 1004 of the conductive structure 1002. Thus, if the thickness of the dielectric material 302 is greater than about 20 nm, the dimensions of the air gap 1802 (FIGS. 18A and 18B) may be too small to achieve any device performance gain. The first portion 1102 of the sidewall 1004 of the conductive structure 1002 may include a portion of the second barrier layer 902 and a portion of the first barrier layer 602, as shown in FIGS. 11A and 11B. In some embodiments, the first portion 1102 of the sidewall 1004 of the conductive structure 1002 includes one or more of the first barrier layer 602, first conductive material 604, second barrier layer 902, and second conductive material 904. The etch back of the dielectric material 302 may be performed by any suitable method, such as dry etching, wet etching, or a combination thereof. In some embodiments, a selective dry etching process is utilized to perform the etch back. The selective dry etching process selectively removes a portion of the dielectric material 302, while the conductive structure 1002 is not removed.

As shown in FIGS. 11A and 11B, the dielectric material 302 surrounds a second portion 1104 of the sidewall 1004 of each conductive structure 1002. The second portion 1104 of the sidewall 1004 of the conductive structure 1002 may include a portion of the first barrier layer 602, as shown in FIGS. 11A and 11B. In some embodiments, the second portion 1104 of the sidewall 1004 of the conductive structure 1002 includes one or more of the first barrier layer 602 and first conductive material 604. In some embodiments, the first portion 1102 is a top portion of the sidewall 1004 of the conductive structure 1002, which is disposed on the second portion 1104, which is a bottom portion of the sidewall 1004 of the conductive structure 1002, as shown in FIGS. 11A and 11B.

Figure 12A:
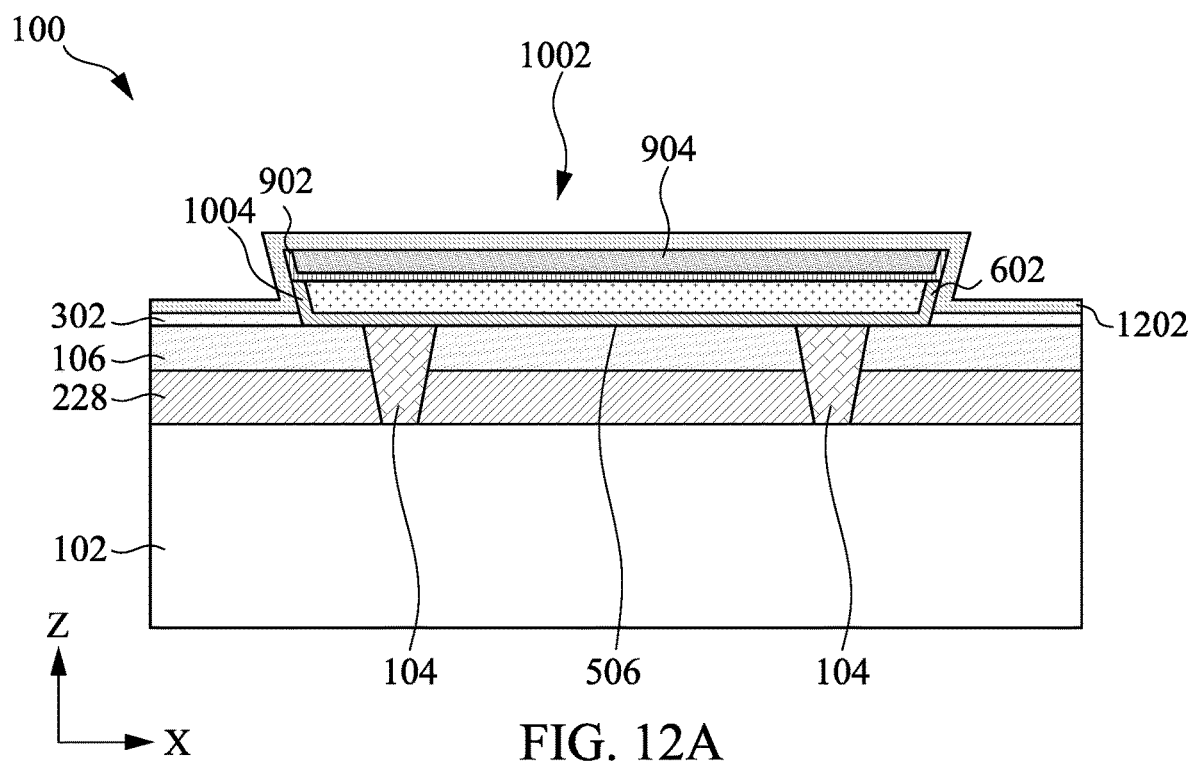
Figure 12B:
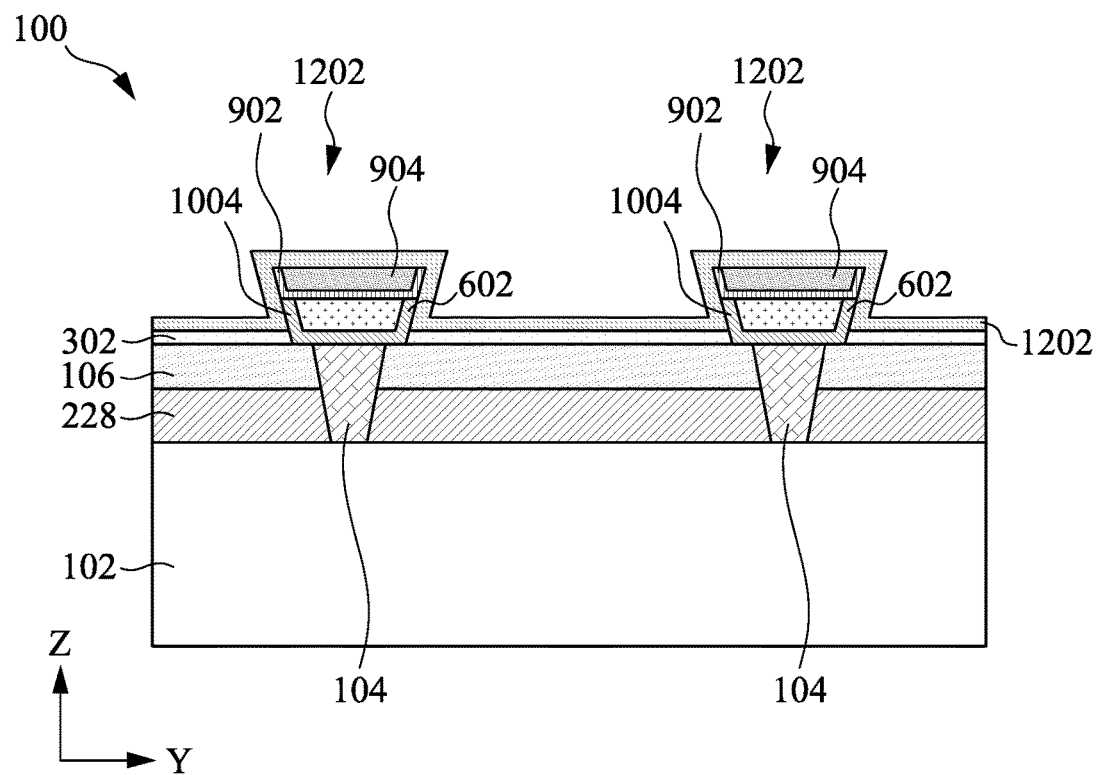
Figure 13A:
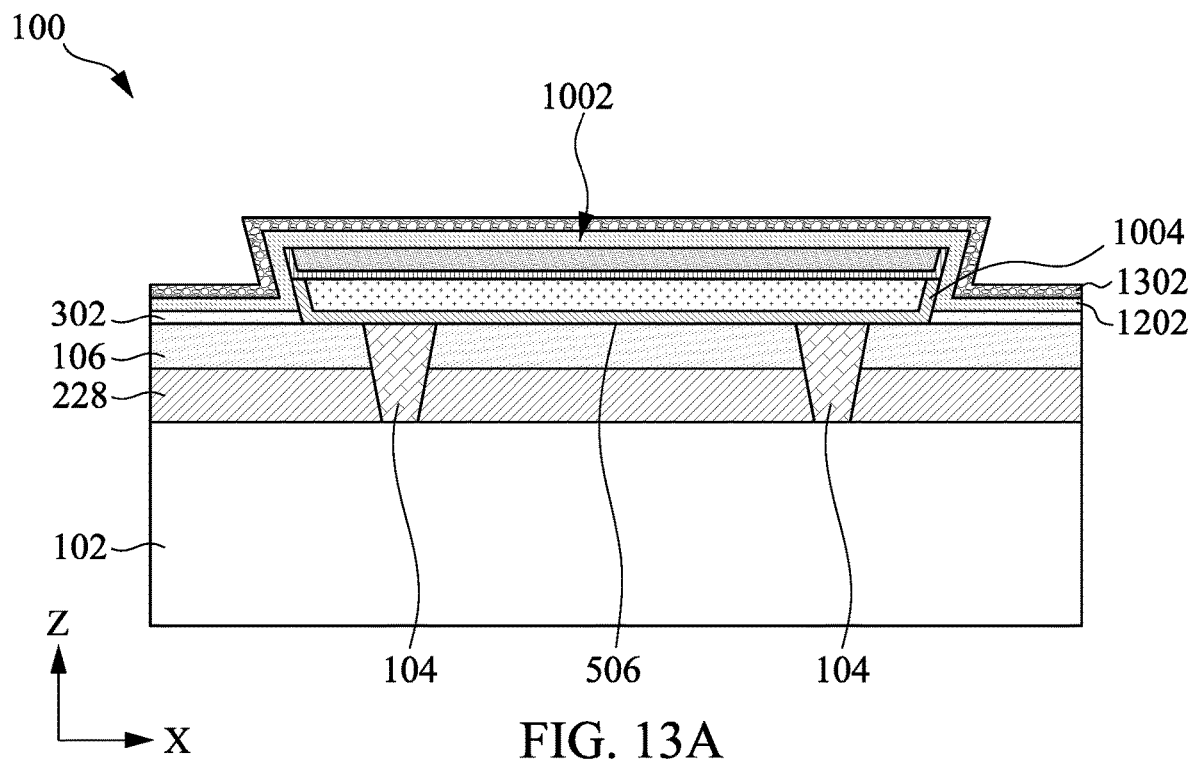
Figure 13B:
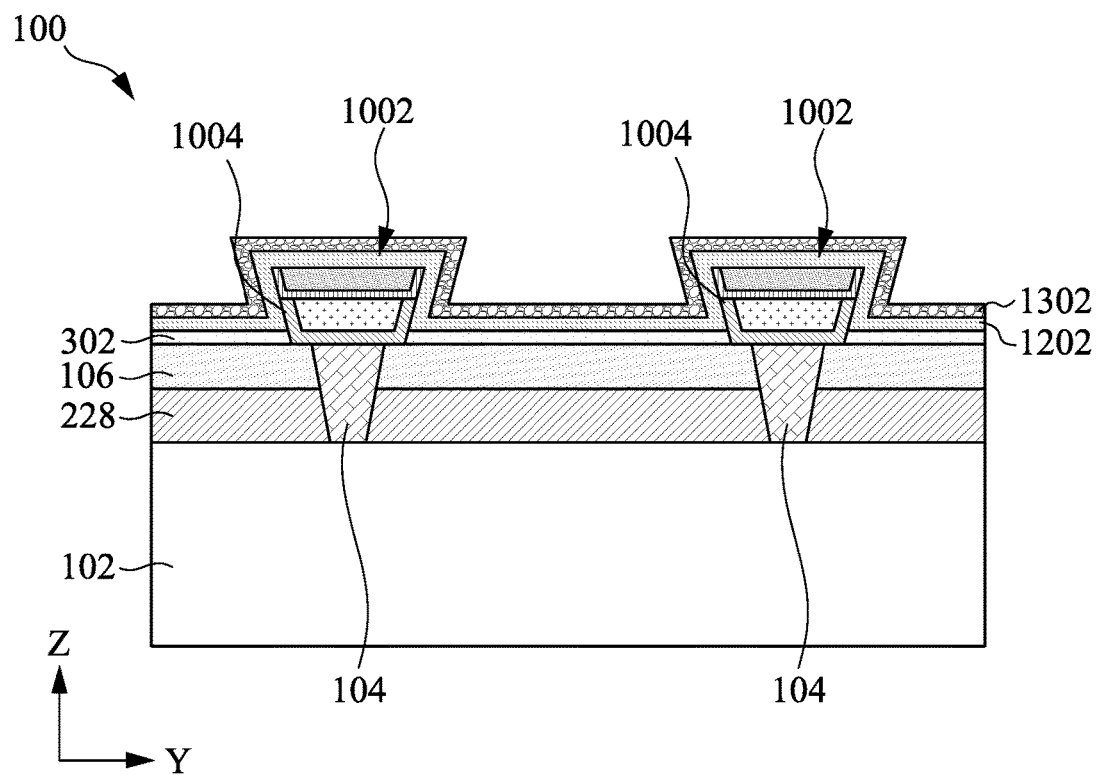

Next, as shown in FIGS. 12A and 12B, a first spacer layer 1202 is formed on the dielectric material 302, the first barrier layer 602, the second barrier layer 902, and the second conductive material 904. The first spacer layer 1202 may include SiC, LaO, AlO, AlON, ZrO, HfO, SiN, ZnO, ZrN, ZrAlO, TiO, TaO, YO, TaCN, ZrSi, SiOCN, SiOC, SiCN, HfSi, or SiO. The first spacer layer 1202 may include a different material as the dielectric material 302. In some embodiments, the first spacer layer 1202 may be conformally deposited and may have a thickness ranging from about 0.5 nm to about 10 nm. The first spacer layer 1202 protects the second conductive material 904 during subsequent removal of portions of a sacrificial spacer layer 1302 (FIGS. 13A and 13B). Thus, if the thickness of the first spacer layer 1202 is less than about 0.5 nm, the first spacer layer 1202 may not be sufficient to protect the second conductive material 904. On the other hand, if the thickness of the first spacer layer 1202 is greater than about 10 nm, the dimensions of the air gap 1802 (FIGS. 18A and 18B) formed subsequently on the first spacer layer 1202 may be too small to achieve any device performance gain. The first spacer layer 1202 may be formed by any suitable method, such as ALD, CVD or PECVD.

Figure 18A:
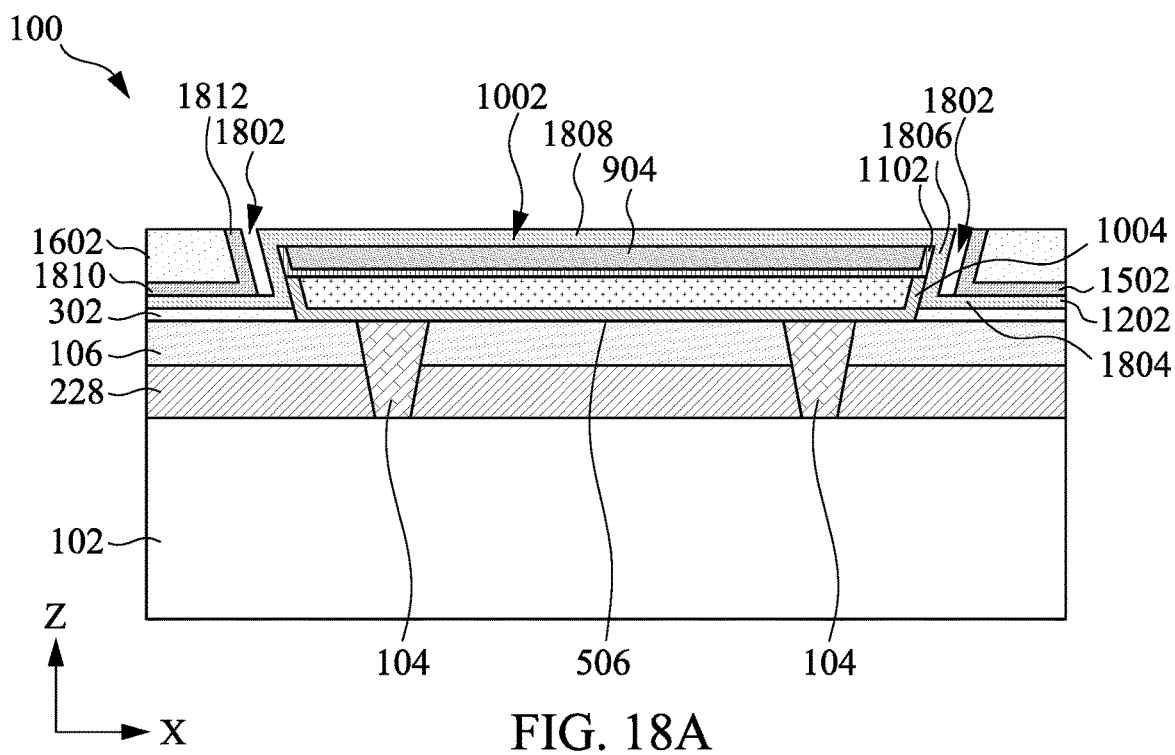
Figure 18B:
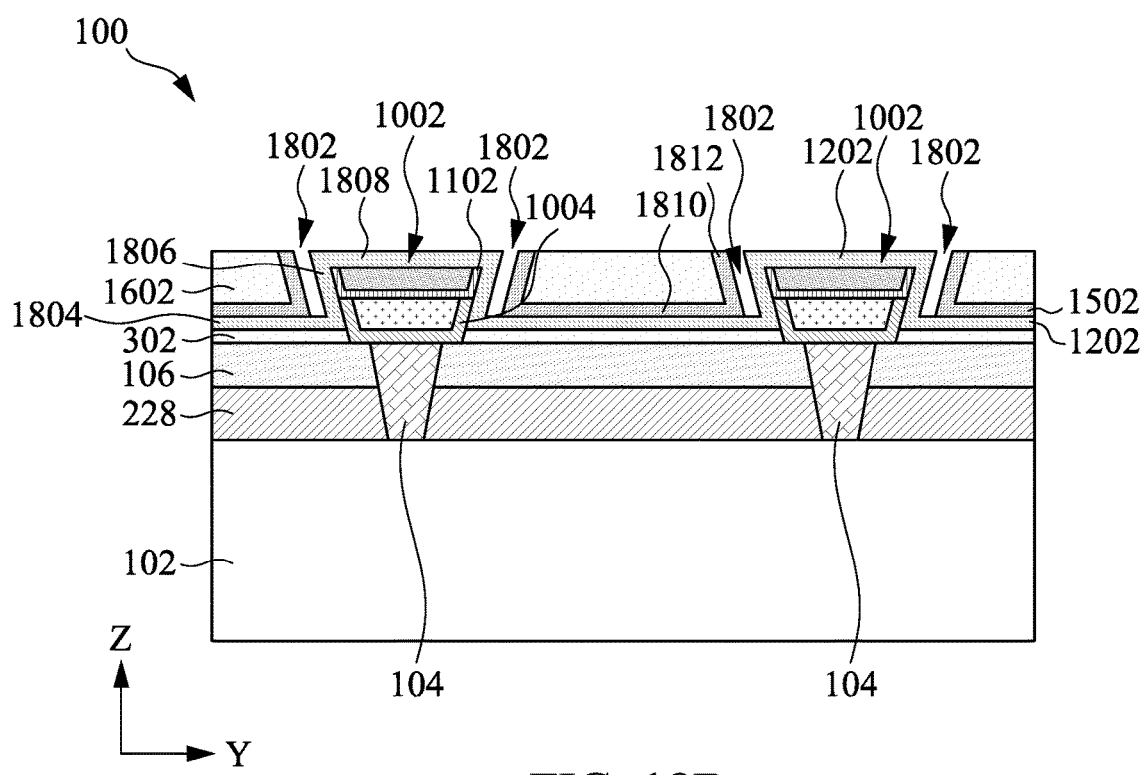

A sacrificial spacer layer 1302 is formed on the first spacer layer 1202, as shown in FIGS. 13A and 13B. The sacrificial spacer layer 1302 may be formed over the dielectric material 302 and conductive structure 1002. The sacrificial spacer layer 1302 may be also formed on the portion of the first spacer layer 1202 adjacent and in contact with the sidewalls 1004 of the conductive structure 1002. The sacrificial spacer layer 1302 may include a material having different etch selectivity than the material of the first spacer layer 1202. For example, the sacrificial spacer layer 1302 may include a semiconductor material, such as Si, Ge, SiGeB, or other suitable semiconductor material, which has a different etch selectivity than the dielectric material of the first spacer layer 1202. In some embodiments, the sacrificial spacer layer 1302 may be conformally deposited and may have a thickness ranging from about 0.5 nm to about 6 nm. The thickness of the sacrificial spacer layer 1302 defines a width of the air gap 1802 (FIGS. 18A and 18B). Thus, if the width of the air gap 1802 is less than about 0.5 nm, the air gap 1802 may not achieve any device performance gain. On the other hand, if the width of the air gap 1802 is greater than about 6 nm, any materials, such as a sealing material 2002 (FIGS. 20A and 20B), formed over the air gap 1802 may fill the entire air gap 1802. The sacrificial spacer layer 1302 may be formed by any suitable method, such as ALD, CVD or PECVD.

Figure 14A:
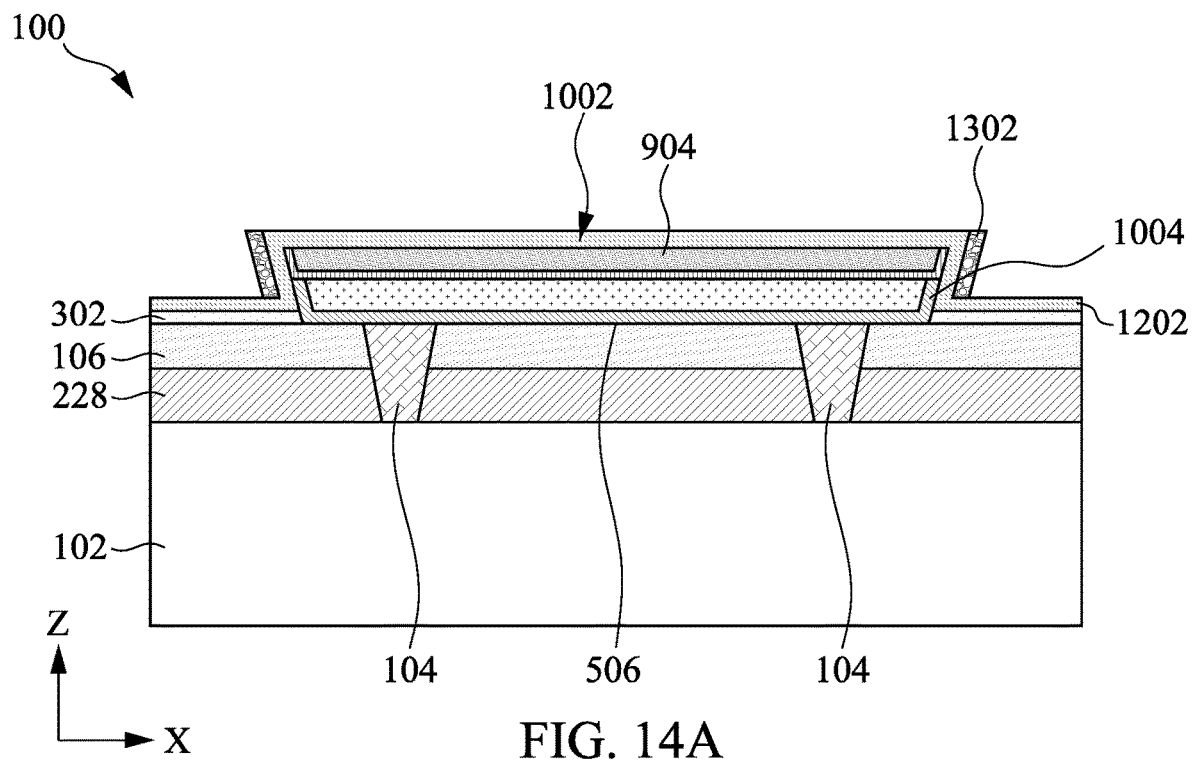
Figure 14B:
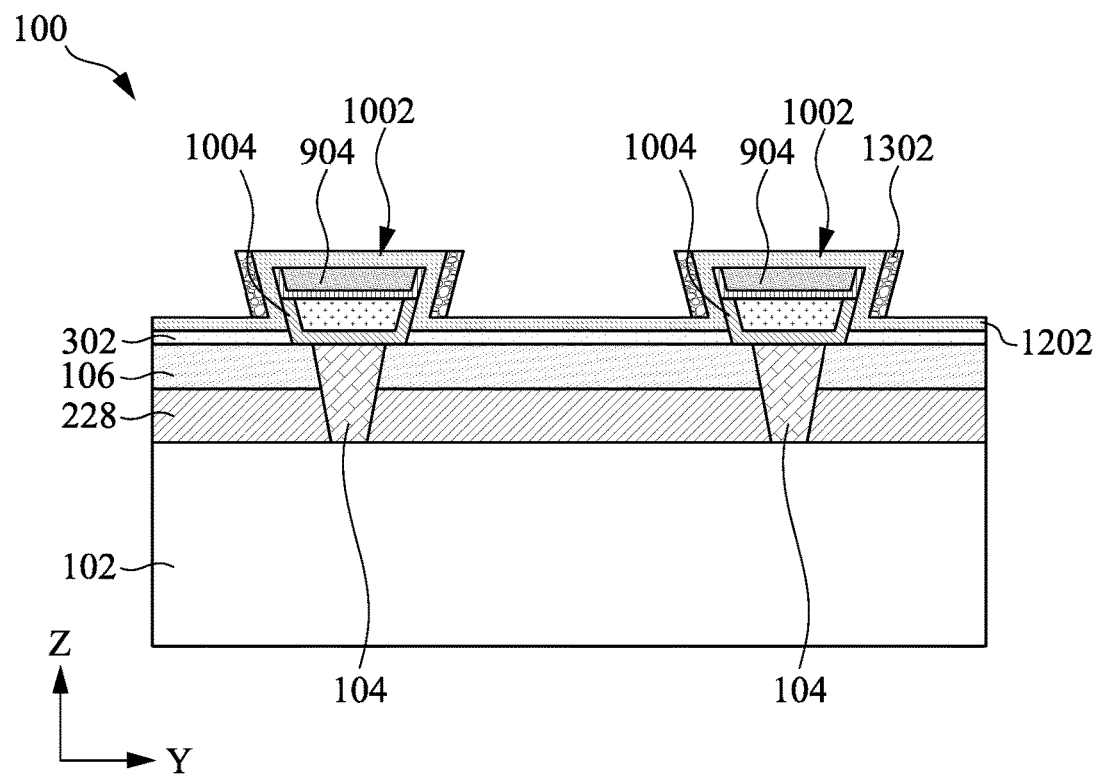

Next, as shown in FIGS. 14A and 14B, portions of the sacrificial spacer layer 1302 are removed. In some embodiments, the portions of the sacrificial spacer layer 1302 disposed over the dielectric material 302 and the conductive structure 1002 are removed, leaving the portion of the sacrificial spacer layer 1302 on the portion of the first spacer layer 1202 adjacent and in contact with the sidewalls 1004 of the conductive structure 1002. In other words, the remaining portion of the sacrificial spacer layer 1302 is disposed adjacent and in contact with the portion of the first spacer layer 1202 that is adjacent and in contact with the sidewall 1004 of the conductive structure 1002. Portions of the first spacer layer 1202 that are disposed on the dielectric material 302 and the conductive structure 1002 are exposed.

The removal of the portions of the sacrificial spacer layer 1302 may be performed by any suitable method, such as an etching process. In one example, the etching process is an anisotropic dry etch process that utilizes chlorine or fluorine based etchant. The anisotropic dry etch removes the portions of the sacrificial spacer layer 1302 disposed on horizontal surfaces but does not remove the portions disposed adjacent the sidewalls 1004 of the conductive structure 1002. The chlorine or fluorine based etchant selectively removes the portions of the sacrificial spacer layer 1302, while the first spacer layer 1202 is not removed. The first spacer layer 1202 protects the second conductive material 904 during the removal of the portions of the sacrificial spacer layer 1302.

Figure 15A:
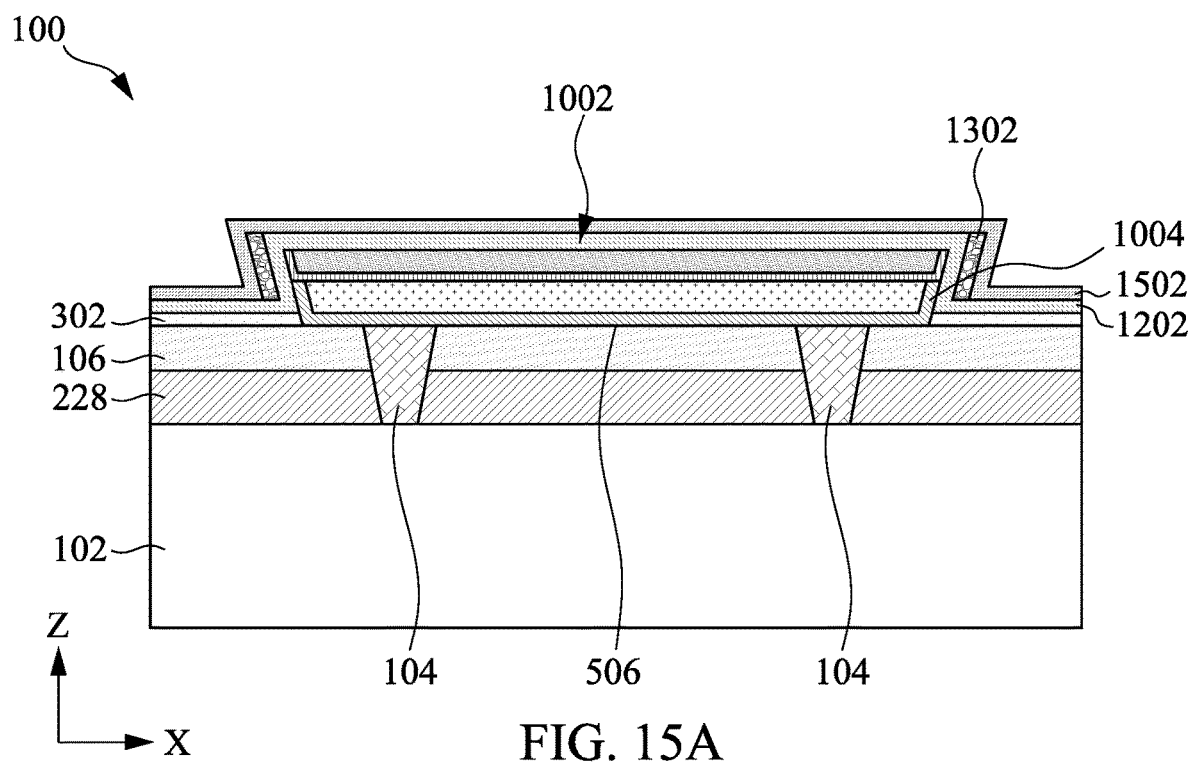
Figure 15B:
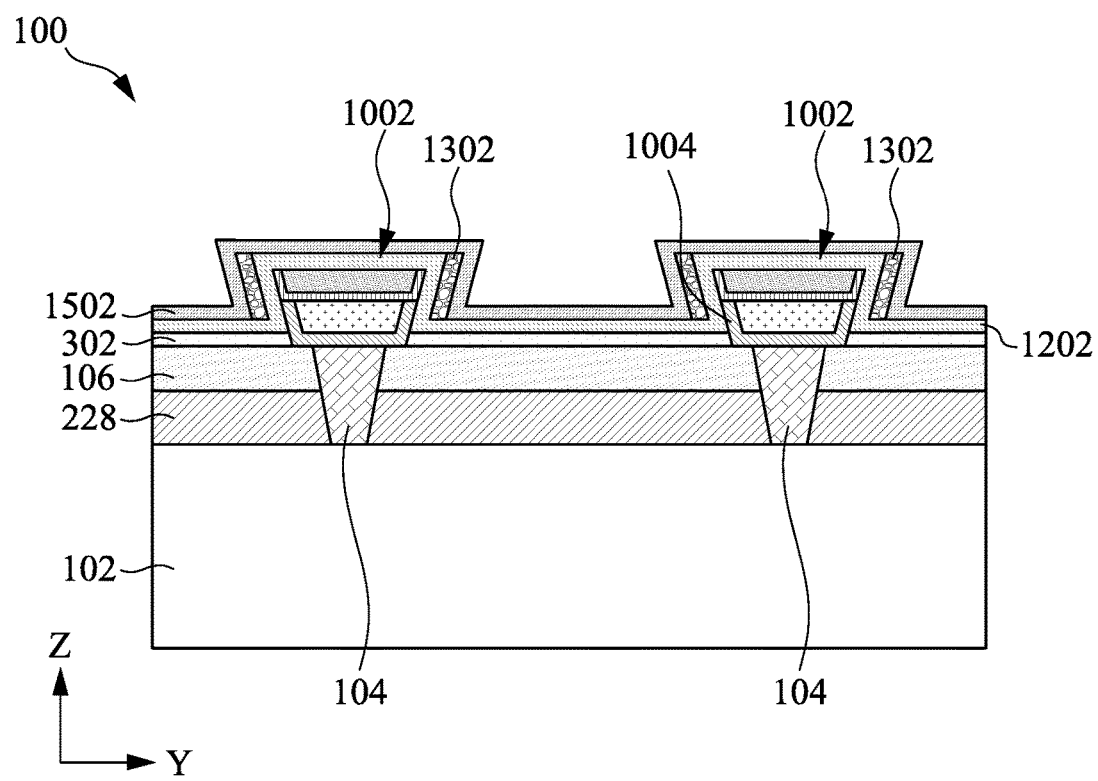
Figure 16A:
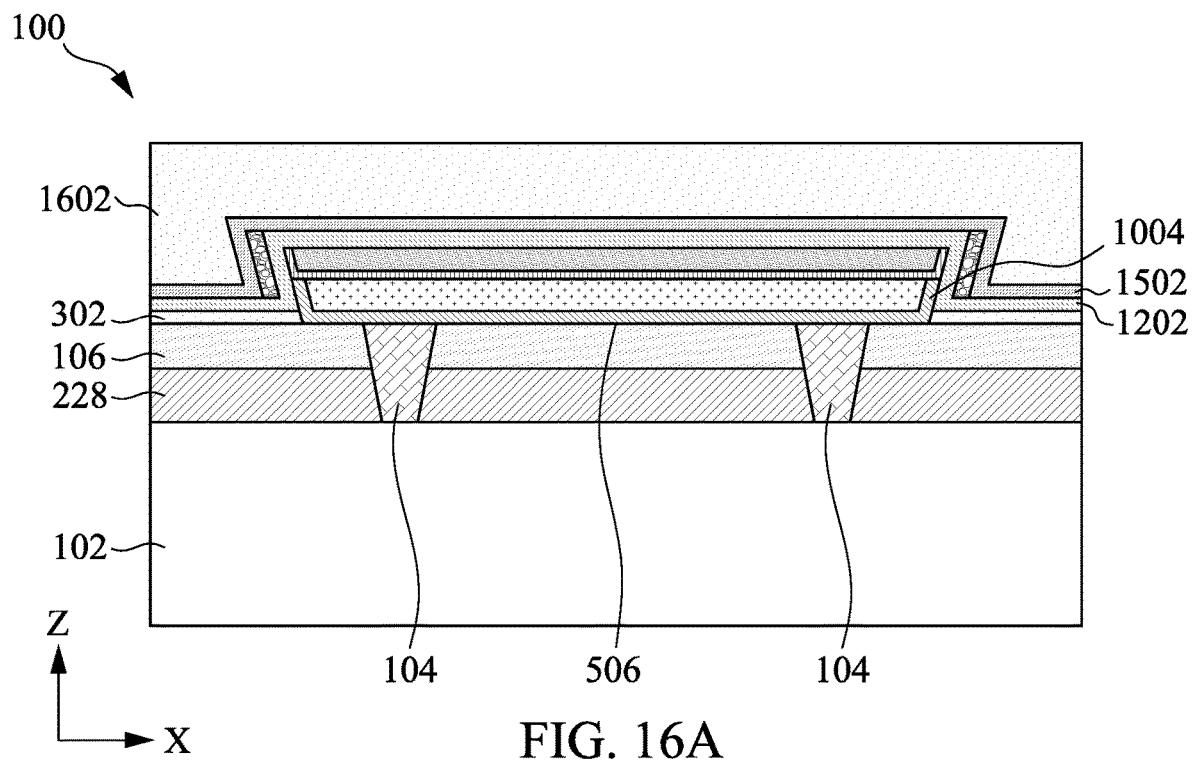
Figure 16B:
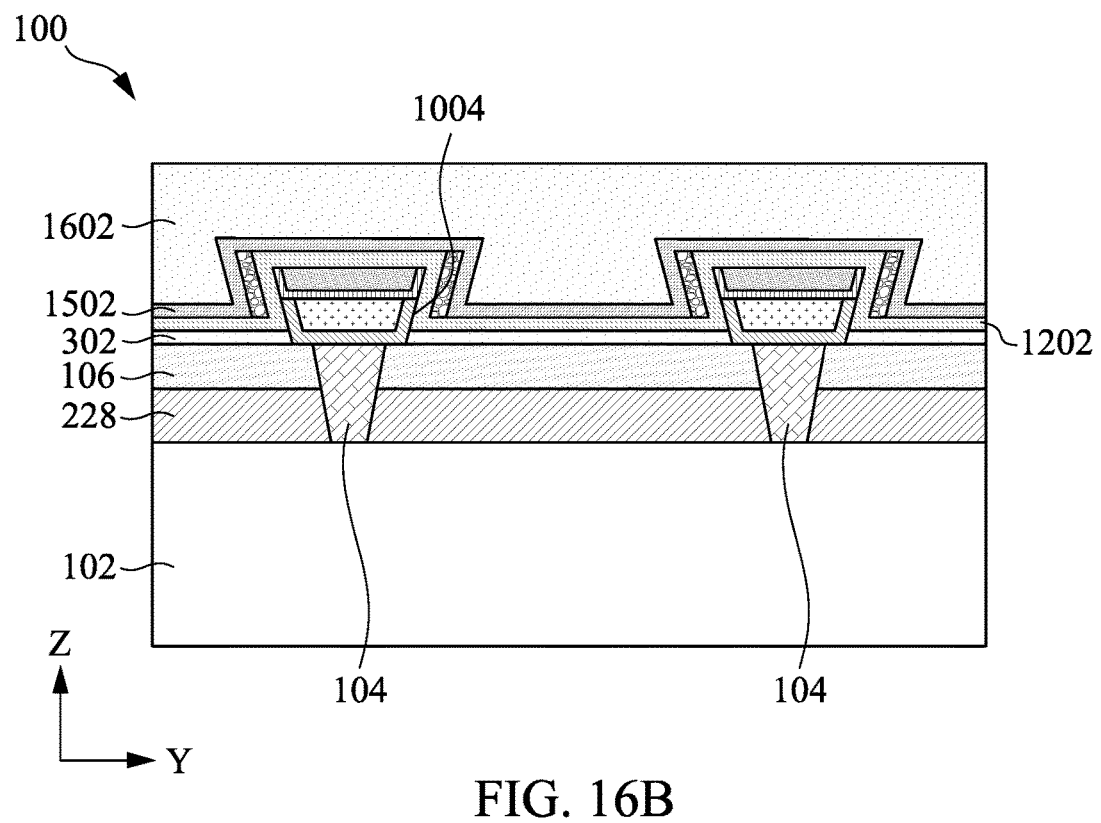

A second spacer layer 1502 is formed on the exposed portions of the first spacer layer 1202 and the sacrificial spacer layer 1302, as shown in FIGS. 15A and 15B. The second spacer layer 1502 may include SiC, LaO, AlO, AlON, ZrO, HfO, SiN, ZnO, ZrN, ZrAlO, TiO, TaO, YO, TaCN, ZrSi, SiOCN, SiOC, SiCN, HfSi, or SiO. The second spacer layer 1502 may include the same or different material as the first spacer layer 1202. In some embodiments, the second spacer layer 1502 includes the same material as a dielectric material 1602 (FIGS. 16A and 16B). In some embodiments, the second spacer layer 1502 may be conformally deposited and may have a thickness ranging from about 0.5 nm to about 6 nm. The second spacer layer 1502 provides structural support to the dielectric material 1602 (FIGS. 16A and 16B). Thus, if the thickness of the second spacer layer 1502 is less than about 0.5 nm, the second spacer layer 1502 may not be sufficient to support the dielectric material 1602 (FIGS. 16A and 16B). On the other hand, if the thickness of the second spacer layer 1502 is greater than about 6 nm, the manufacturing cost is increased without significant advantage. The second spacer layer 1502 may be formed by any suitable method, such as ALD, CVD or PECVD.

Next, as shown in FIGS. 16A and 16B, the dielectric material 1602 is formed on the second spacer layer 1502. The dielectric material 1602 may be a second ILD layer. The dielectric material 1602 may include SiC, LaO, AlO, AlON, ZrO, HfO, SiN, ZnO, ZrN, ZrAlO, TiO, TaO, YO, TaCN, ZrSi, SiOCN, SiOC, SiCN, HfSi, or SiO. The dielectric material 1602 may include the same or different material as the dielectric material 302. In some embodiments, the dielectric material 1602 include a different material as the first spacer layer 1202. The dielectric material 1602 may be formed by any suitable method, such as CVD or PECVD. The dielectric material 1602 may have a thickness ranging from about 1 nm to about 20 nm, and the thickness of the dielectric material 1602 may be defined by the thickness of the dielectric material 302 prior and after the etch back and the thicknesses of the first and second spacer layers 1202, 1502.

Figure 17A:
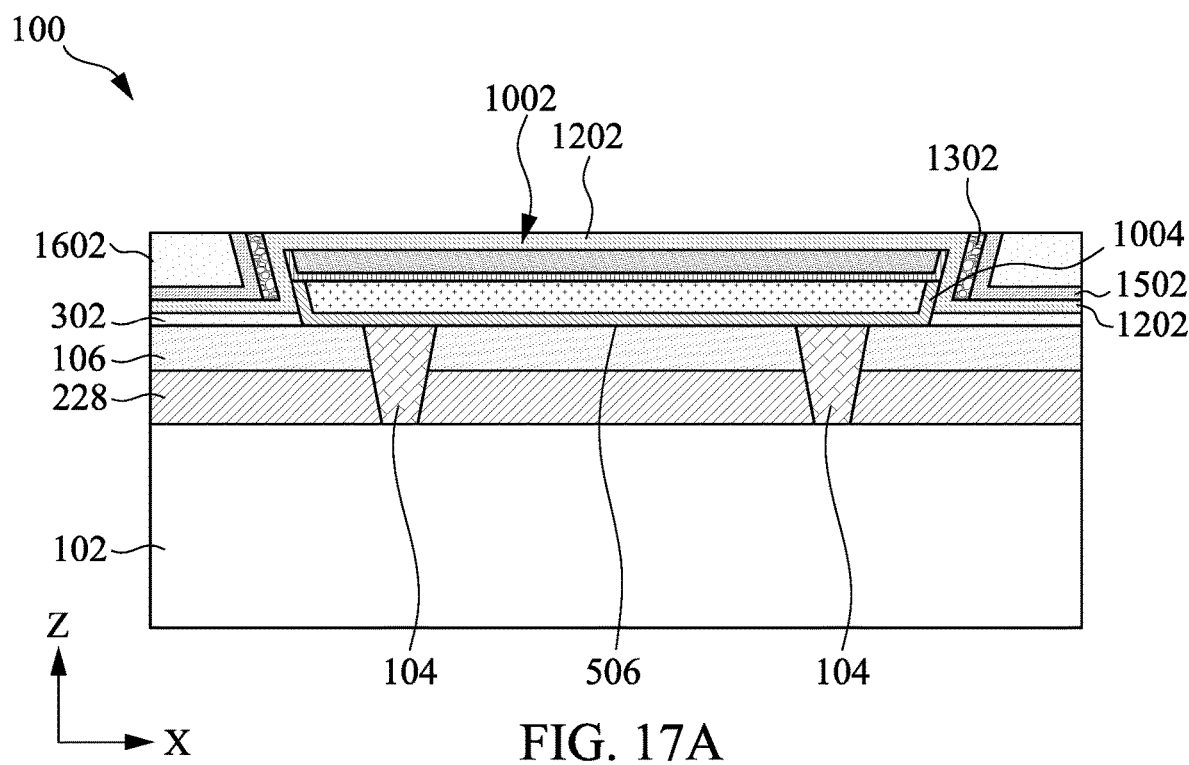
Figure 17B:
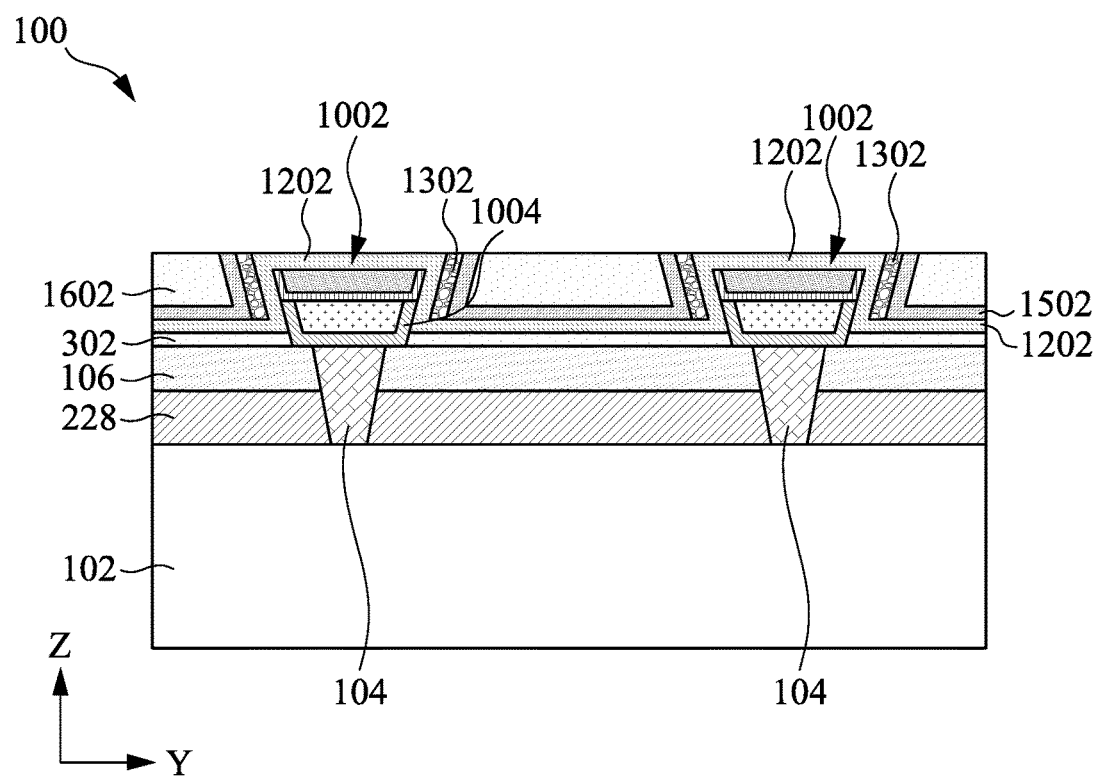

A planarization process is performed to expose the sacrificial spacer layer 1302 and the first spacer layer 1202, as shown in FIGS. 17A and 17B. The planarization process may be any suitable process, such as a CMP process. The planarization process removes a portion of the dielectric material 1602 and a portion of the second spacer layer 1502 so the sacrificial spacer layer 1302 is exposed. Next, as shown in FIGS. 18A and 18B, the sacrificial spacer layers 1302 disposed between the first spacer layers 1202 and the second spacer layers 1502 are removed to form the air gaps 1802. The removal of the sacrificial spacer layer 1302 may be performed by any suitable method, such as an etching process. In one example, the etching process is selective dry etch process that utilizes chlorine or fluorine based etchant. The chlorine or fluorine based etchant selectively removes the sacrificial spacer layer 1302, while the first spacer layer 1202, the second spacer layer 1502, and the dielectric material 1602 are not removed. The second spacer layer 1502 may function as a structure support for the dielectric material 1602. Without the second spacer layer 1502, the dielectric material 1602 may collapse into the air gaps 1802 during the subsequent processes.

The air gap 1802 may have a width defined by the thickness of the sacrificial spacer layer 1302. In some embodiments, the air gap 1802 has a width ranging from about 0.5 nm to about 6 nm. Because air gap 1802 is defined by the portion of the sacrificial spacer layer 1302 disposed adjacent and in contact with the portion of the first spacer layer 1202, which is adjacent and in contact with the first portion 1102 of the sidewall 1004 of the conductive structure 1002, the air gap 1802 also forms the acute angel A with respect to the top surface 506 of the dielectric material 106. As shown in FIGS. 18A and 18B, the first spacer layer 1202 includes a first portion 1804 disposed on the dielectric material 302, a second portion 1806 adjacent and in contact with the first portion 1102 of the sidewall 1004 of the conductive structure 1002, and a third portion 1808 disposed on the conductive structure 1002. The second portion 1806 of the first spacer layer 1202 surrounds the first portion 1102 of the sidewall 1004 of the conductive structure 1002. For example, the second portion 1806 of the first spacer layer 1202 surrounds the first portion 1102 of the 4 surfaces of the sidewall 1004, as shown in FIGS. 18A and 18B. The second spacer layer 1502 includes a first portion 1810 disposed on the first portion 1804 of the first spacer layer 1202 and a second portion 1812 adjacent and in contact with the dielectric material 1602. The air gap 1802 is disposed between the second portion 1812 of the second spacer layer 1502 and the second portion 1806 of the first spacer layer 1202.

Figure 19:
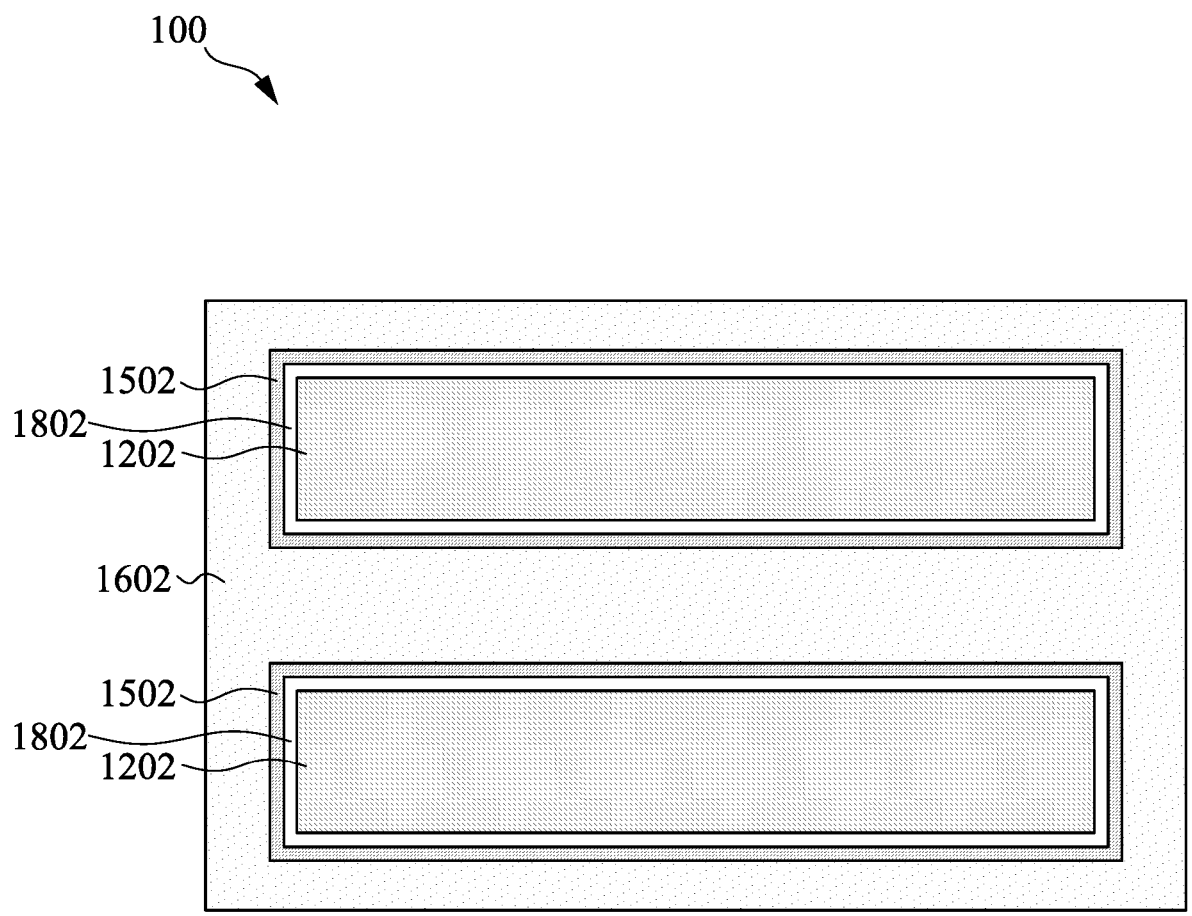
FIG. 19 is a top view of the semiconductor device structure at the manufacturing stage as shown in FIGS. 18A and 18B, in accordance with some embodiments.

FIG. 19 is a top view of the semiconductor device structure 100 at the manufacturing stage as shown in FIGS. 18A and 18B, in accordance with some embodiments. As shown in FIG. 19, the first spacer layer 1202 is disposed on the conductive structure 1002 (FIGS. 18A and 18B), and the air gap 1802 surrounds the second portion 1806 (FIGS. 18A and 18B) of the first spacer layer 1202. The air gap 1802 is a continuous air gap that surrounds the second portion 1806 (FIGS. 18A and 18B) of the first spacer layer 1202, which surrounds the first portion 1102 (FIGS. 18A and 18B) of the sidewall 1004 of the conductive structure 1002. Thus, the air gap 1802 surrounds the first portion 1102 (FIGS. 18A and 18B) of the sidewall 1004, such as the first portion 1102 (FIGS. 18A and 18B) of the 4 surfaces of the sidewall 1004, of the conductive structure 1002. The air gap 1802 is surrounded by the second portion 1812 of the second spacer layer 1502, which is surrounded by the dielectric material 1602. The air gap 1802, which has a lower k value compared to the materials of the first spacer layer 1202 and the second spacer layer 1502, is formed to isolate conductive structures 1002 (FIGS. 18A and 18B), leading to reduced capacitive coupling between neighboring conductive structures 1002 (FIGS. 18A and 18B).

Figure 20A:
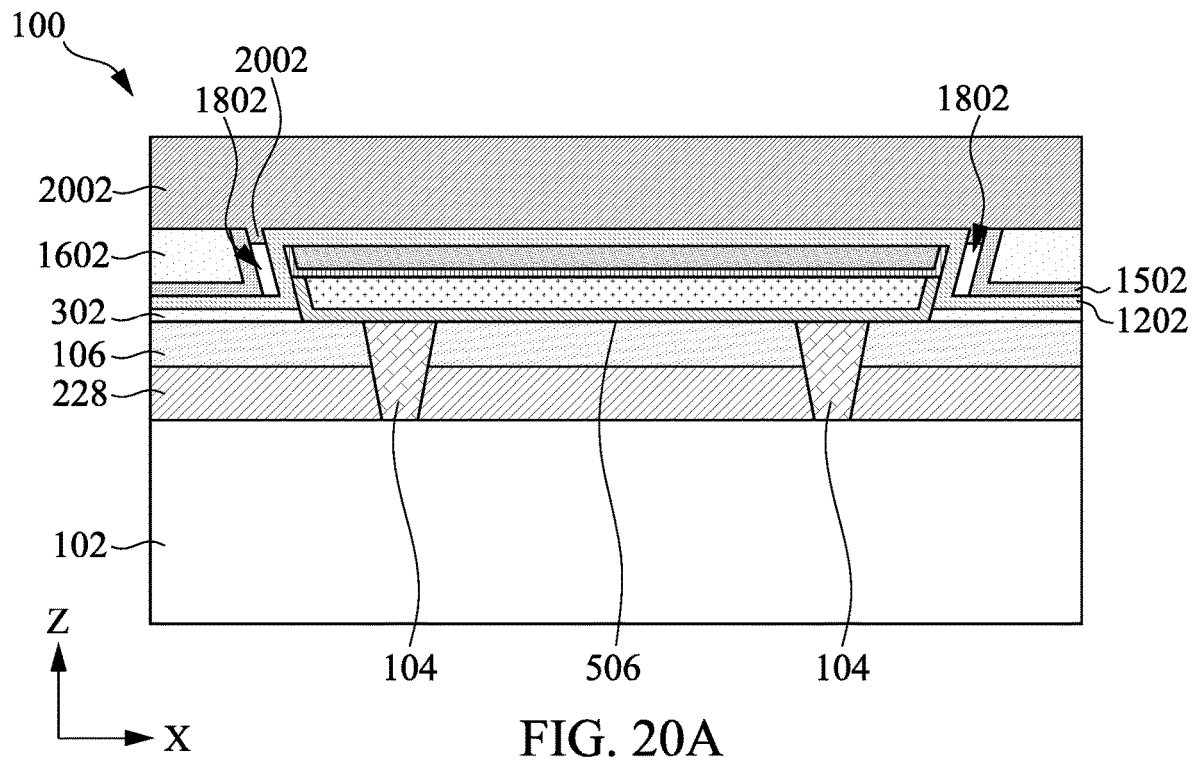

FIGS. 20A-22A are cross-sectional side views of various stages of manufacturing the semiconductor device structure 100 taken along line A-A of FIG. 1, in accordance with some embodiments. FIGS. 20B-22B are cross-sectional side views of various stages of manufacturing the semiconductor device structure 100 taken along line B-B of FIG. 1, in accordance with some embodiments. As shown in FIGS. 20A and 20B, after the formation of the air gaps 1802, a sealing material 2002 is formed on the dielectric material 1602, the first spacer layer 1202, and the second spacer layer 1502. The sealing material 2002 may also seal the air gaps 1802 by partially filling the air gaps 1802. The sealing material 2002 does not completely fill the air gaps 1802 due to the small opening (i.e., the width of the air gap 1802) of the air gap 1802. The sealing material 2002 may include SiC, LaO, AlO, AlON, ZrO, HfO, SiN, ZnO, ZrN, ZrAlO, TiO, TaO, YO, TaCN, ZrSi, SiOCN, SiOC, SiCN, HfSi, or SiO. The sealing material 2002 may include the same or different material as the first spacer layer 1202. The sealing material 2002 may be formed by any suitable method, such as CVD.

Figure 21A:
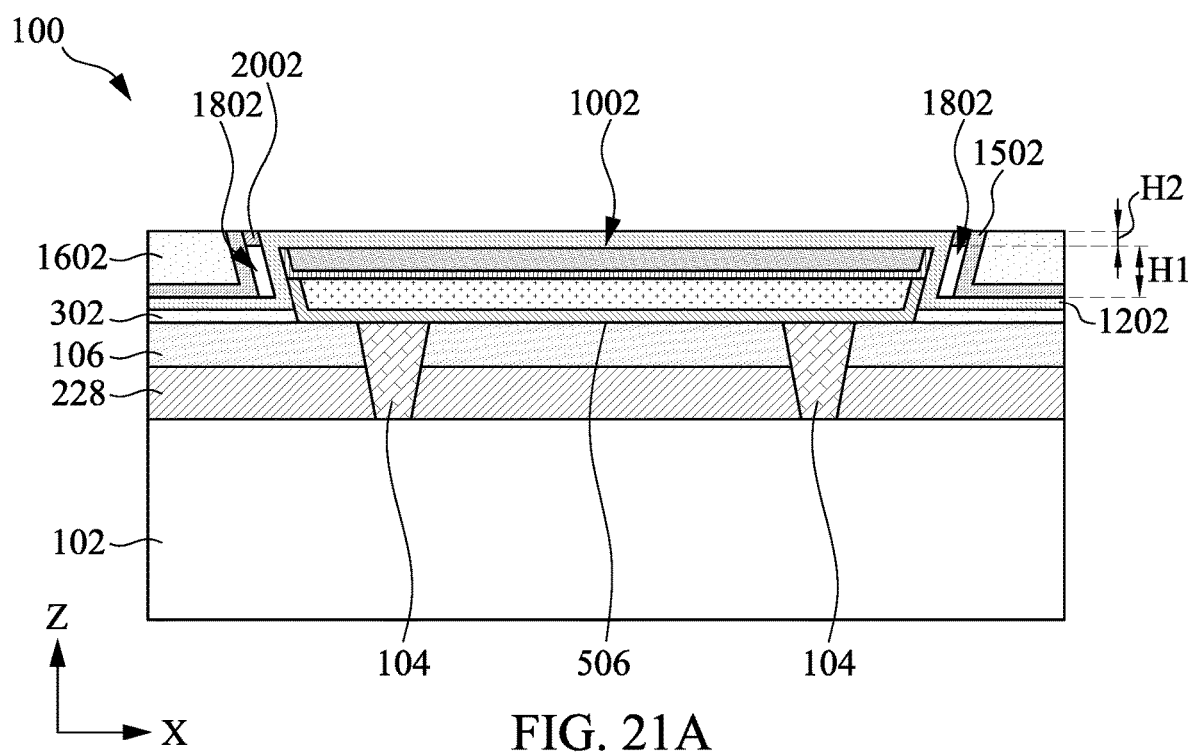
Figure 21B:
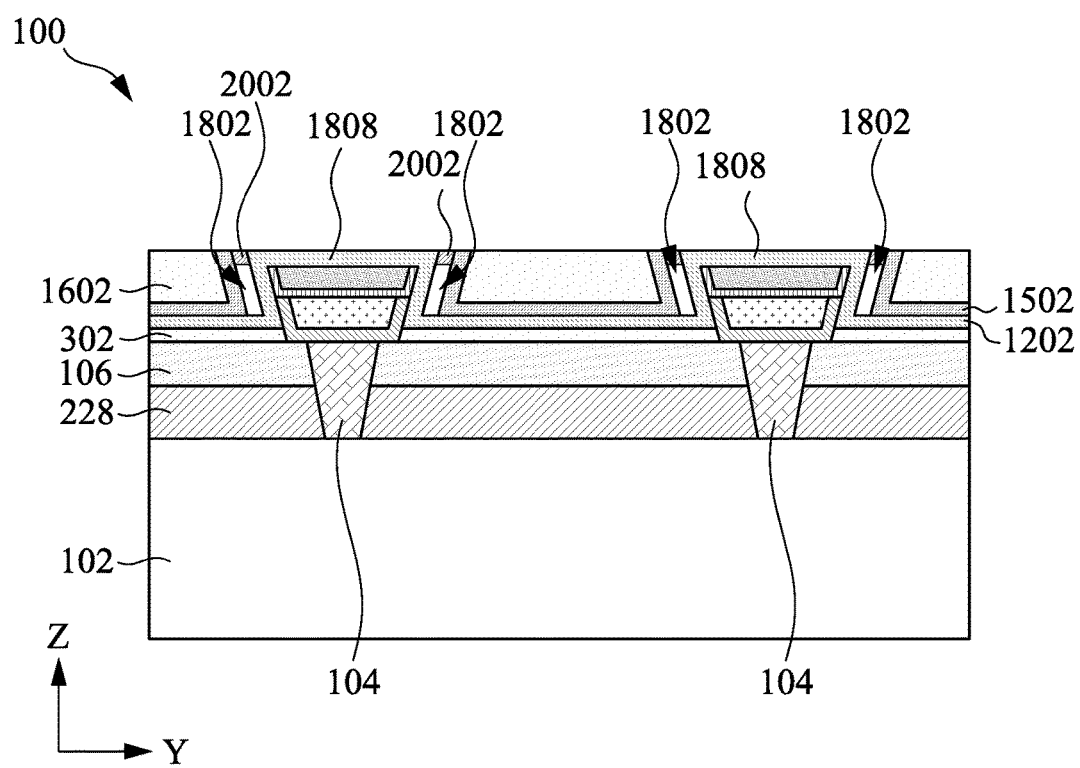

Next, as shown in FIGS. 21A and 21B, a planarization process is performed to expose the dielectric material 1602 and the first spacer layer 1202. The planarization process may be any suitable process, such as a CMP process. The planarization process removes portions of the sealing material 2002 so the third portion 1808 of the first spacer layer 1202 is substantially coplanar with the dielectric material 1602. As described above, the sealing material 2002 partially fills the air gap 1802. As a result, the air gap 1802 has a height H1 ranging from about 1 nm to about 20 nm, and the sealing material 2002 has a height H2 ranging from about 0.5 nm to about 5 nm. If the height H1 of the air gap 1802 is less than about 1 nm, the air gap 1802 may be too small to provide improved electrical isolation between neighboring conductive structures 1002. The upper limit of the height H1 is defined by the thickness of the dielectric material 302 prior to being etched back. The sealing material 2002 seals the air gap 1802 to prevent the air gap 1802 from being filled by any material formed over the air gap 1802. Thus, if the height H2 is less than about 0.5 nm, the sealing material 2002 may not be sufficient to seal the air gap 1802. On the other hand, if the height H2 is greater than about 5 nm, the dimensions of the air gap 1802 may be too small to achieve any device performance gain.

Figure 22A:
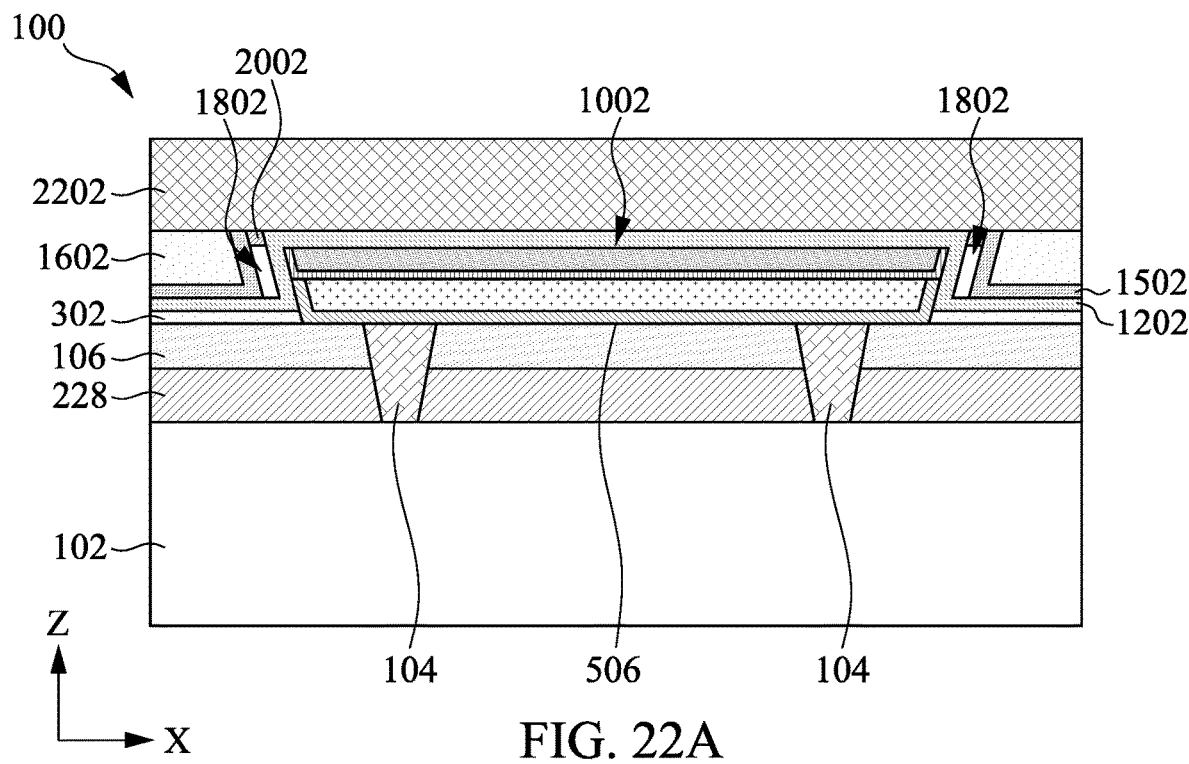
Figure 22B:
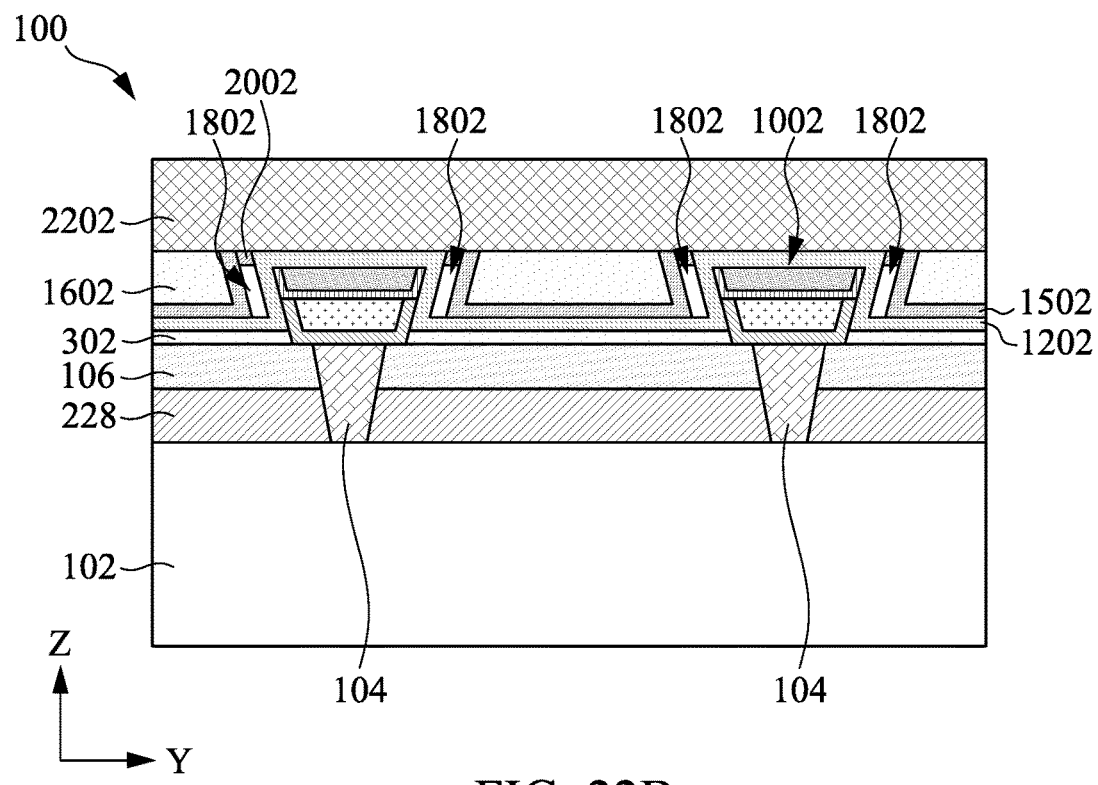

A dielectric material 2202 is formed on the dielectric material 1602, the first spacer layer 1202, the second spacer layer 1502, and the sealing material 2002, as shown in FIGS. 22A and 22B. The dielectric material 2202 may be a third ILD layer. The dielectric material 2202 may include SiC, LaO, AlO, AlON, ZrO, HfO, SiN, ZnO, ZrN, ZrAlO, TiO, TaO, YO, TaCN, ZrSi, SiOCN, SiOC, SiCN, HfSi, or SiO. The dielectric material 2202 may include the same or different material as the dielectric material 1602. The dielectric material 2202 may include a different material as the first spacer layer 1202. The dielectric material 2202 may have a thickness ranging from about 1 nm to about 40 nm and may be formed by any suitable method, such as CVD or PECVD. In some embodiments, the sealing material 2002 includes the same material as the dielectric material 2202, and the sealing material 2002 may function as the third ILD layer. In such embodiments, the planarization process described in FIGS. 21A and 21B and the deposition of the dielectric material 2202 described in FIGS. 22A and 22B are skipped. Conductive structures (not shown) may be formed in the dielectric material 2202 and the first spacer layer 1202 to connect to the conductive structures 1002.

Figure 23A:
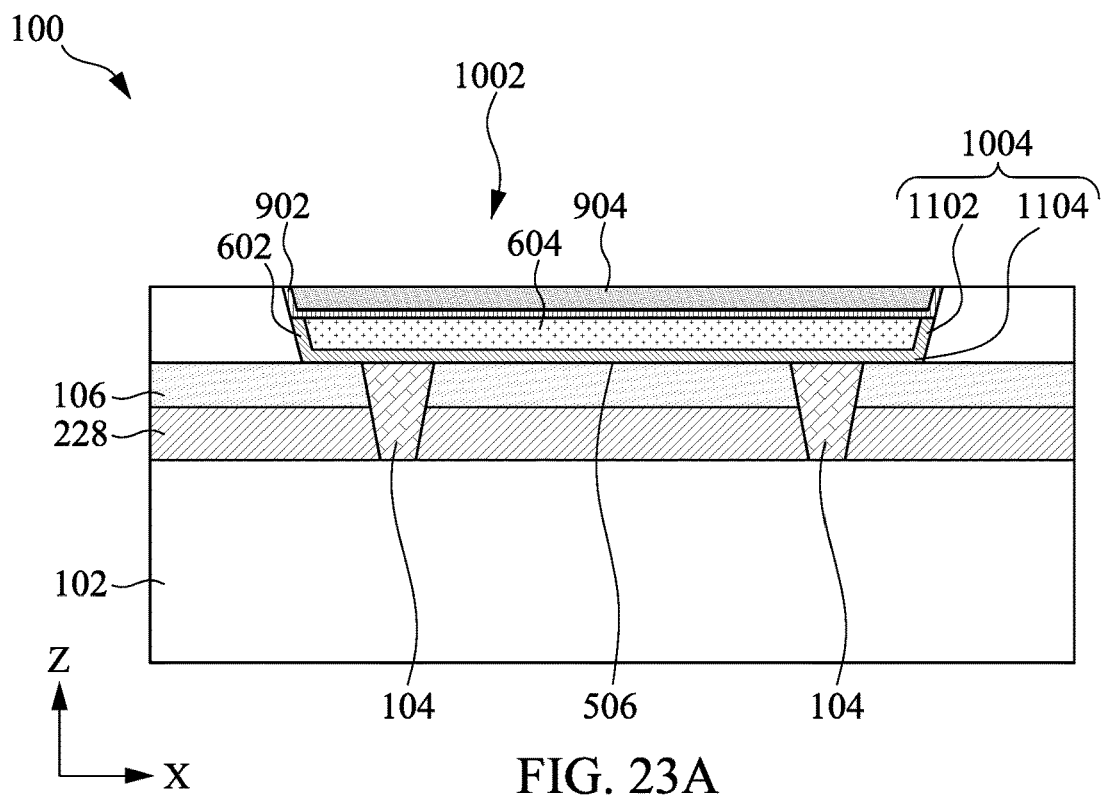
Figure 23B:
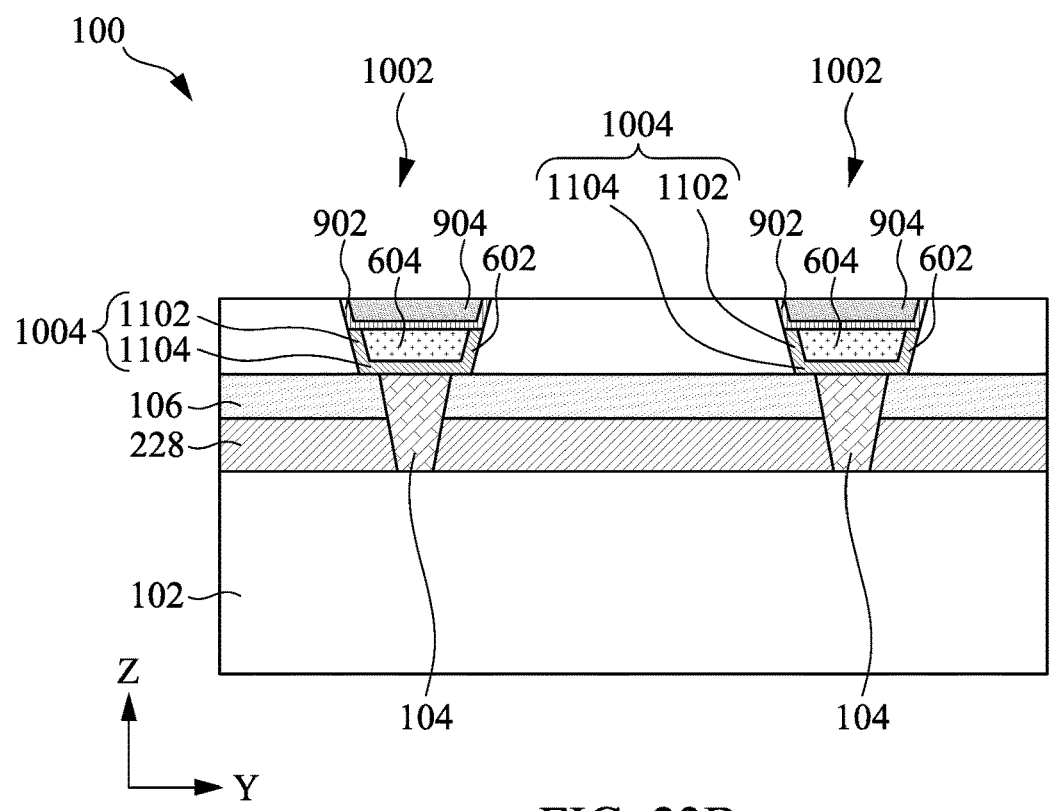
Figure 24A:
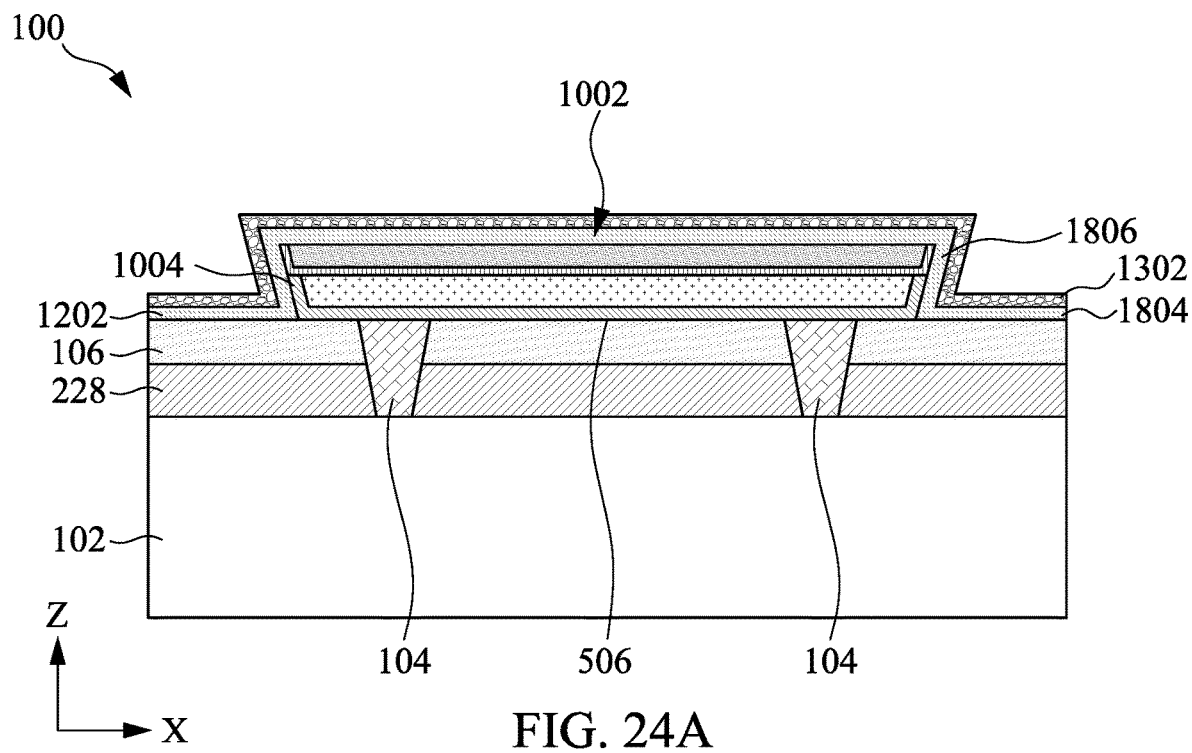
Figure 24B:
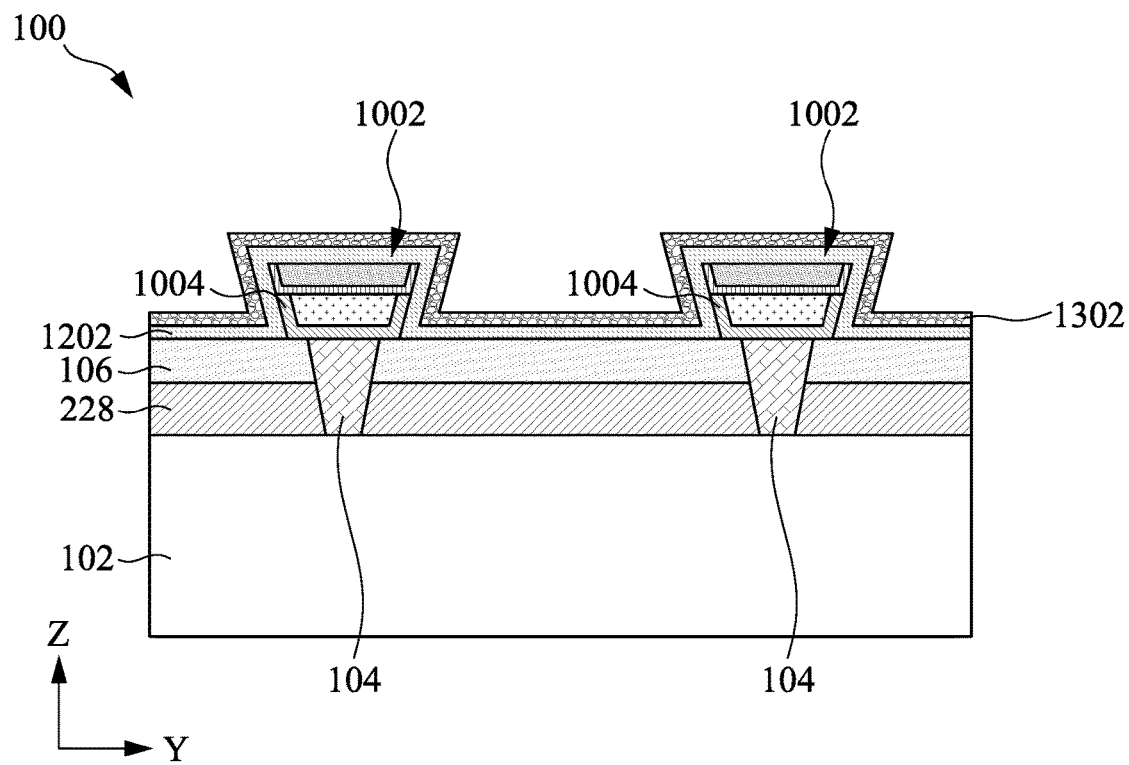

FIGS. 23A and 23B are cross-sectional side views of the semiconductor device structure 100 at the manufacturing stage right after FIGS. 10A and 10B, in accordance with some embodiments. As shown in FIGS. 23A and 23B, instead of etching back the dielectric material 302 as shown in FIGS. 11A and 11B, the dielectric material 302 is removed. Thus, both first portion 1102 and second portion 1104 of the sidewall 1004 of the conductive structure 1002 are exposed. Next, similar to the processes described in FIGS. 12A, 12B, 13A, and 13B, the first spacer layer 1202 and the sacrificial spacer layer 1320 are formed, as shown in FIGS. 24A and 24B. The first portion 1804 of the first spacer layer 1202 is formed on the dielectric material 106, and the second portion 1806 of the first spacer layer 1202 surrounds both the first portion 1102 and the second portion 1104 of the sidewall 1004.

Figure 25A:
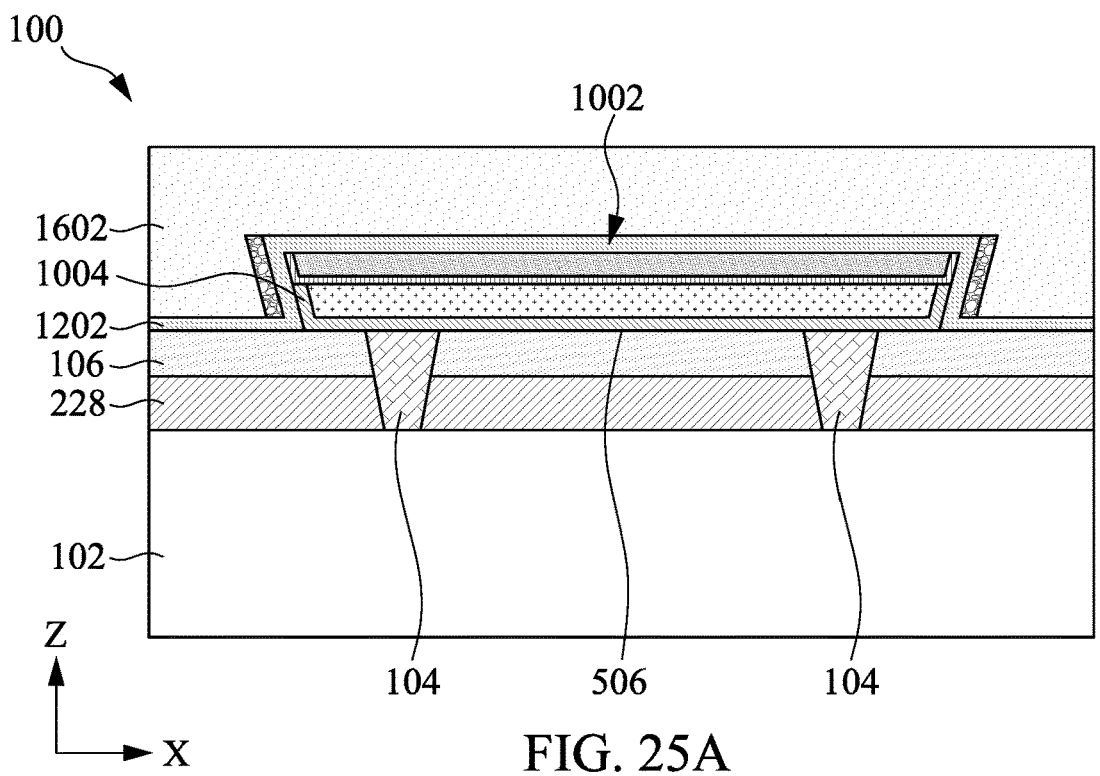
Figure 25B:
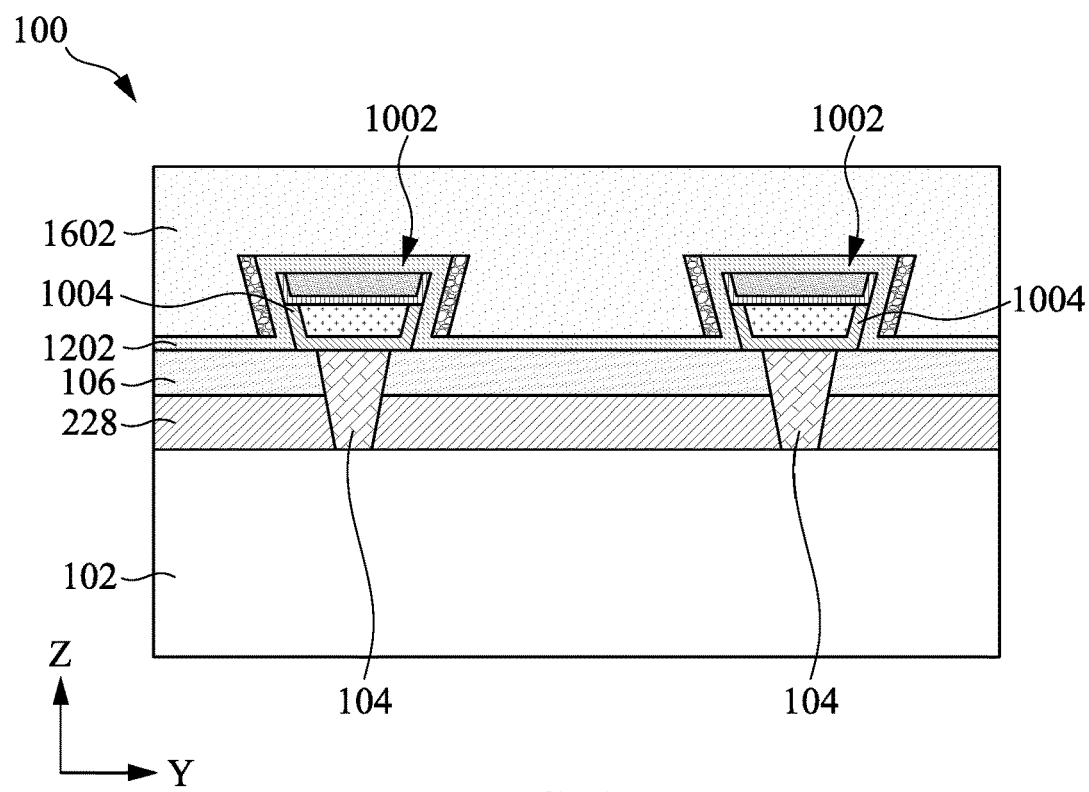
Figure 26A:
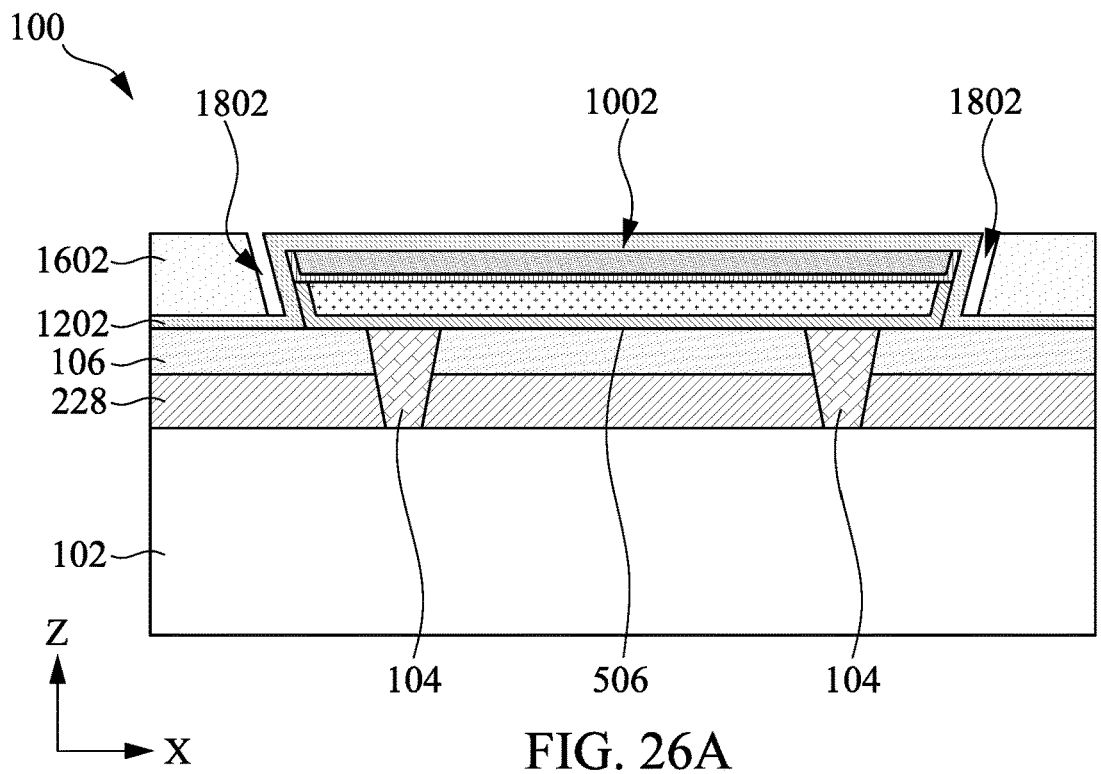
Figure 26B:
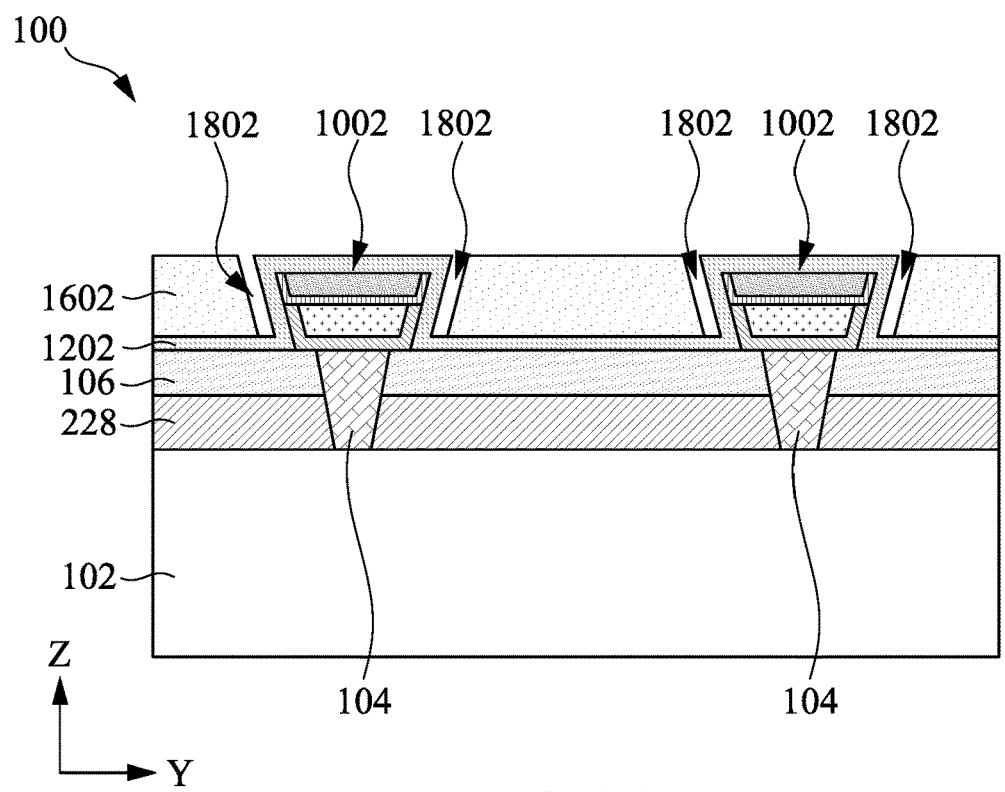

Next, as shown in FIGS. 25A and 25B, portions of the sacrificial spacer layer 1302 are removed, similar to the processes described in FIGS. 14A and 14B. Unlike the processes described in FIGS. 15A and 15B, the second spacer layer 1502 is omitted, and the dielectric material 1602 is formed on the first spacer layer 1202 and the sacrificial spacer layer 1302. Similar to the processes described in FIGS. 17A, 17B, 18A, and 18B, a planarization process is performed to expose the sacrificial spacer layer 1302 and the first spacer layer 1202, as shown in FIGS. 26A and 26B. The sacrificial spacer layer 1302 is removed to form air gaps 1802.

Figure 20B:
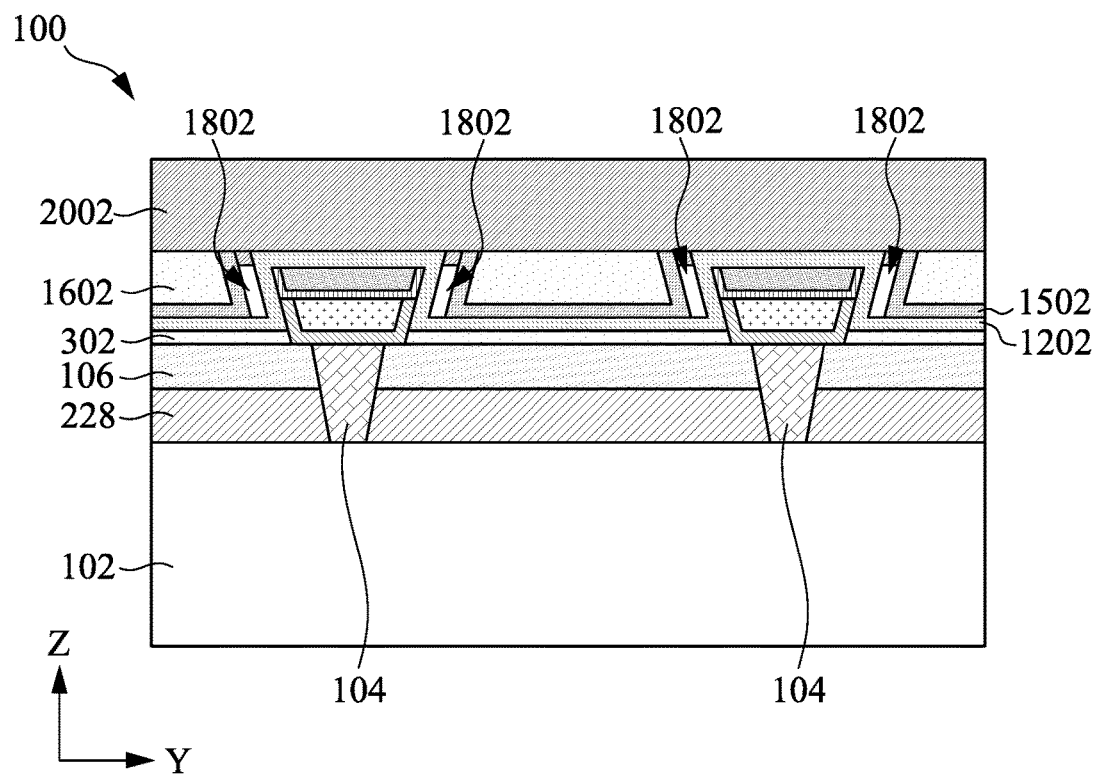
Figure 27A:
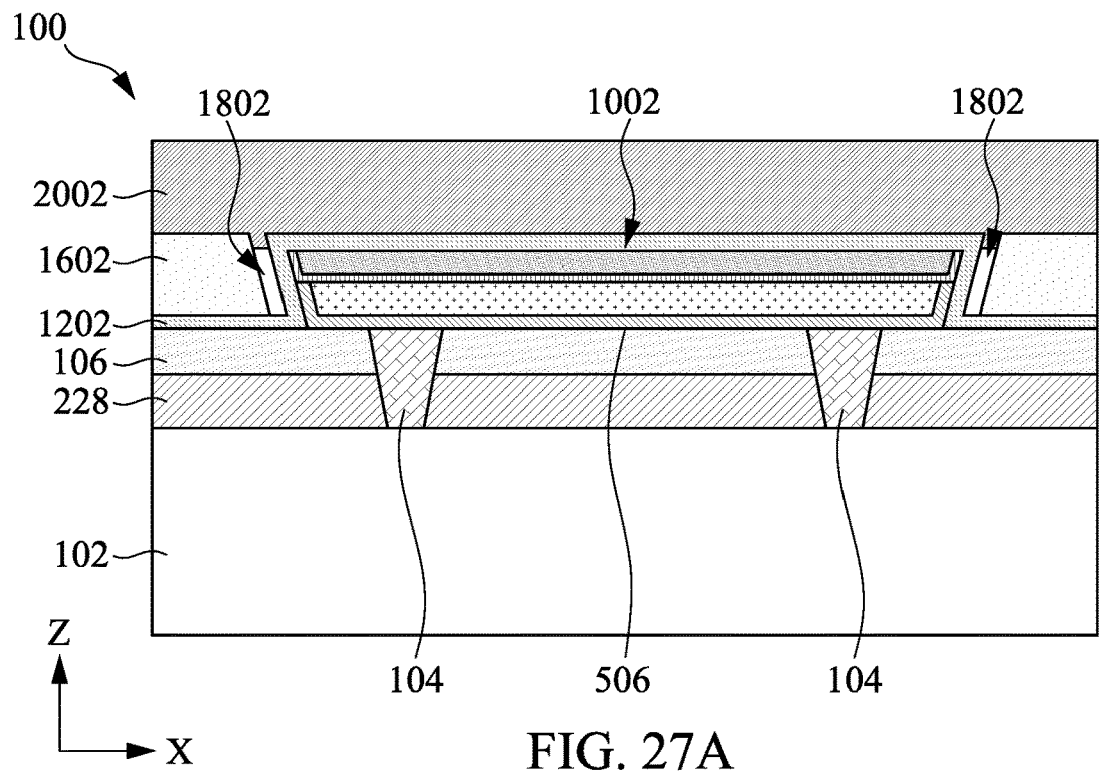
Figure 27B:
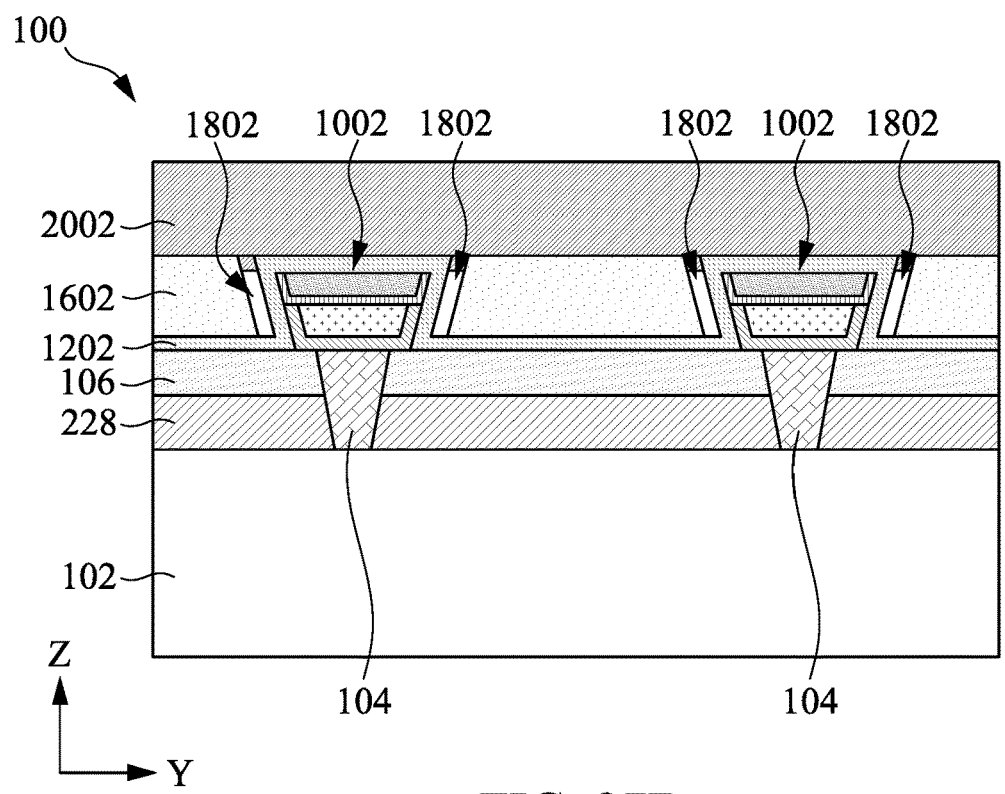
Figure 28A:
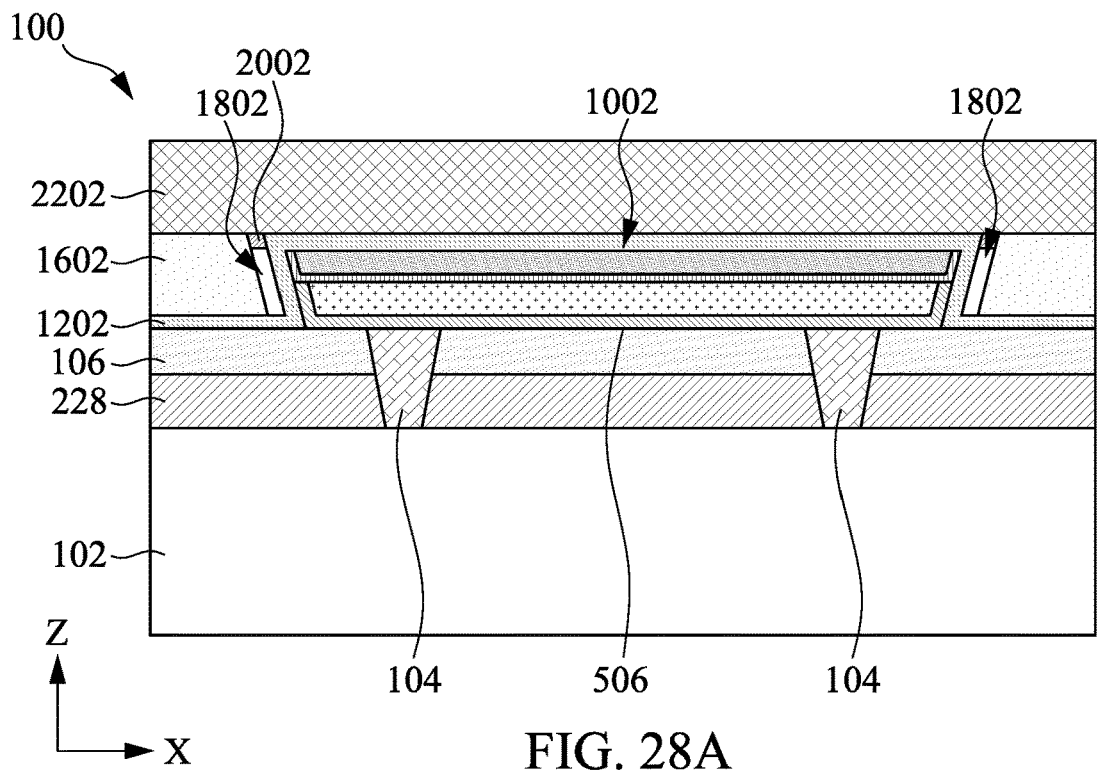
Figure 28B:
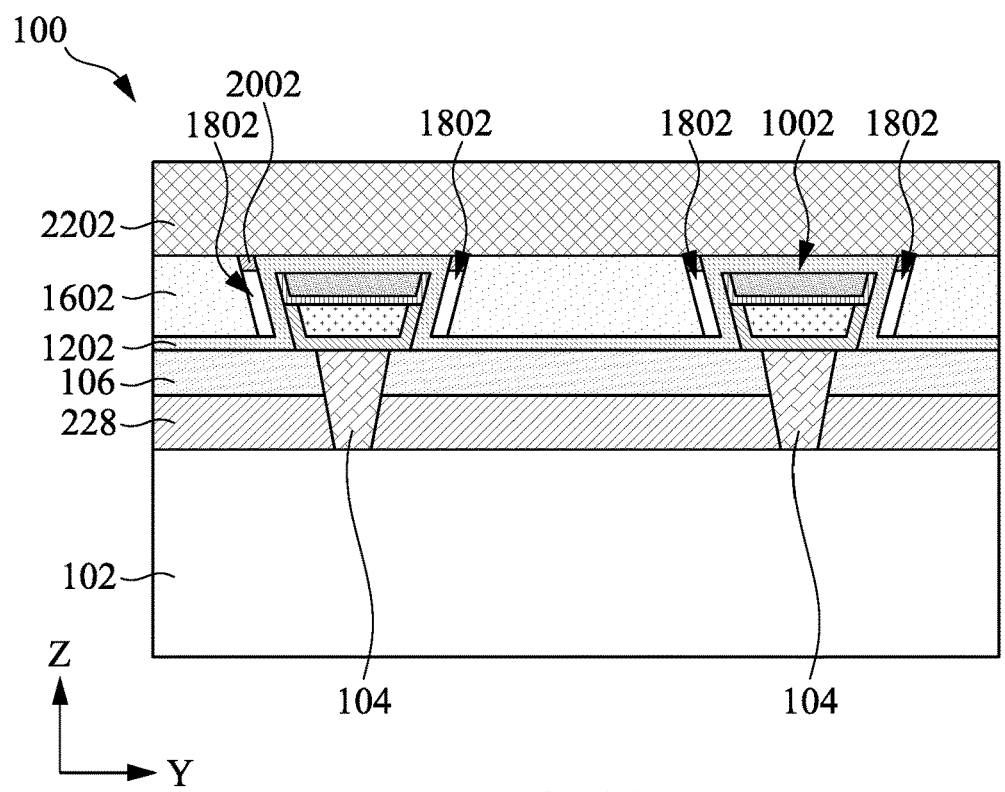

Next, similar to the processes described in FIGS. 20A and 20B, the sealing material 2002 is formed on the dielectric material 1602 and the first spacer layer 1202, as shown in FIGS. 27A and 27B. The sealing material 2002 may also seal the air gaps 1802 by partially filling the air gaps 1802. As described above, in some embodiments, the sealing material 2002 may include the same material as the dielectric material 2202, and the sealing material 2002 may function as the third ILD layer. In some embodiments, as shown in FIGS. 28A and 28B, a planarization process is performed to expose the dielectric material 1602 and the first spacer layer 1202, and the dielectric material 2202 is formed on the exposed dielectric material 1602, the sealing material 2002, and the first spacer layer 1202.

The present disclosure provides a semiconductor device structure 100 including a device 202, a conductive structure 1002 disposed above the device 202, a first spacer layer 1202 disposed on the conductive structure 1002 and surrounds at least a portion 1102 of a sidewall 1004 of the conductive structure 1002, a second spacer layer 1502 disposed on the first spacer layer, and an air gap 1802 formed between a portion 1812 of the second spacer layer 1502 and a portion 1806 of the first spacer layer 1202. The air gap 1802 surrounds the portion 1102 of the sidewall 1004 of the conductive structure 1002. Some embodiments may achieve advantages. For example, the conductive material 904 of the conductive structure 1002 may be protected by the third portion 1808 of the first spacer layer 1202 during the removal of portions of the sacrificial spacer layer 1302. The second spacer layer 1502 may provide structural support to the dielectric material 1602. The air gap 1802 has the lowest k value compared to the first and second spacer layers 1202, 1502, which reduces capacitive coupling between neighboring conductive structures 1002.

An embodiment is a semiconductor device structure. The semiconductor device structure includes a device, a conductive structure disposed over the device, and the conductive structure includes a sidewall having a first portion and a second portion. The semiconductor device structure further includes a first spacer layer including a third portion and a fourth portion, the third portion surrounds the first portion of the sidewall of the conductive structure, and the fourth portion is disposed on the conductive structure. The semiconductor device structure further includes a first dielectric material surrounding the third portion of the first spacer layer, and an air gap is formed between the first dielectric material and the third portion of the first spacer layer. The first dielectric material includes a first material different than a second material of the first spacer layer, and the first dielectric material is substantially coplanar with the fourth portion of the first spacer layer.

Another embodiment is a semiconductor device structure. The semiconductor device structure includes a device, a conductive structure disposed over the device, and the conductive structure includes a sidewall having a first portion and a second portion. The semiconductor device structure further includes a first dielectric material surrounding the first portion of the sidewall of the conductive structure, and a first spacer layer including a third portion, a fourth portion, and a fifth portion. The third portion is disposed on the first dielectric material, the fourth portion surrounds the second portion of the sidewall of the conductive structure, and the fifth portion is disposed on the conductive structure. The semiconductor device structure further includes a second spacer layer including a sixth portion and a seventh portion. The sixth portion of the second spacer layer is disposed on the third portion of the first spacer layer, and an air gap is formed between the seventh portion of the second spacer layer and the fourth portion of the first spacer layer.

A further embodiment is a method. The method includes forming a device over a substrate, forming a first dielectric material over the device, forming an opening in the first dielectric material, and forming a conductive structure in the opening. The conductive structure includes a sidewall having a first portion and a second portion. The method further includes removing a portion of the first dielectric material and forming a first spacer layer on a remaining portion of the first dielectric material, the first portion of the sidewall of the conductive structure, and the conductive structure. The first spacer layer includes a third portion disposed on the remaining portion of the first dielectric material, a fourth portion disposed on the first portion of the sidewall of the conductive structure, and a fifth portion disposed on the conductive structure. The method further includes forming a sacrificial spacer layer on the first spacer layer, removing a portion of the sacrificial spacer layer to expose the third portion and fifth portion of the first spacer layer, forming a second spacer layer on the exposed third portion and fifth portion of the first spacer layer and on a remaining portion of the sacrificial layer, forming a second dielectric material on the second spacer layer, and removing the remaining portion of the sacrificial spacer layer to form an air gap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device structure, comprising:
a device;
a conductive structure disposed over the device, wherein the conductive structure comprises a sidewall having a first portion and a second portion;
a first spacer layer comprising a third portion and a fourth portion, wherein the third portion surrounds the first portion of the sidewall of the conductive structure and the fourth portion is disposed on the conductive structure; and
a first dielectric material surrounding the third portion of the first spacer layer, wherein an air gap is formed between the first dielectric material and the third portion of the first spacer layer, wherein the first dielectric material comprises a first material different than a second material of the first spacer layer, and wherein a top surface of the first dielectric material is substantially coplanar with a top surface of the fourth portion of the first spacer layer.

2. The semiconductor device structure of claim 1, wherein the sidewall includes four surfaces.

3. The semiconductor device structure of claim 2, wherein the air gap surrounds the third portion of the first spacer layer, and the first dielectric material surrounds the air gap.

4. The semiconductor device structure of claim 1, wherein the conductive structure comprises a first conductive feature.

5. The semiconductor device structure of claim 4, wherein the conductive structure further comprises a second conductive feature disposed over the first conductive feature.

6. The semiconductor device structure of claim 4, wherein the conductive structure further comprises a first barrier layer, wherein the first barrier layer is in contact with the third portion of the first spacer layer, and the first conductive feature is disposed on the first barrier layer.

7. The semiconductor device structure of claim 6, wherein the conductive structure further comprises a second barrier layer disposed on the first conductive feature and a second conductive feature disposed on the second barrier layer.

8. The semiconductor device structure of claim 1, further comprising a second dielectric material surrounding the second portion of the sidewall of the conductive structure.

9. The semiconductor device structure of claim 8, wherein a bottom surface of the second dielectric material and a bottom surface of the conductive structure are substantially coplanar.

10. A semiconductor device structure, comprising:
a device;
a conductive structure disposed over the device, wherein the conductive structure includes a sidewall having a first portion and a second portion;
a first dielectric material surrounding the first portion of the sidewall of the conductive structure;
a first spacer layer comprising a third portion, a fourth portion, and a fifth portion, wherein the third portion is disposed on the first dielectric material, the fourth portion surrounds the second portion of the sidewall of the conductive structure, and the fifth portion is disposed on the conductive structure;
a second spacer layer comprising a sixth portion and a seventh portion, wherein the sixth portion of the second spacer layer is disposed on the third portion of the first spacer layer, and an air gap is formed between the seventh portion of the second spacer layer and the fourth portion of the first spacer layer; and
a sealing material disposed over the air gap and between the fourth portion of the first spacer layer and the seventh portion of the second spacer layer.

11. The semiconductor device structure of claim 10, wherein the conductive structure comprises a barrier layer in contact with the first dielectric material and the fourth portion of the first spacer layer.

12. The semiconductor device structure of claim 11, wherein the conductive structure further comprises a conductive feature disposed on the barrier layer.

13. The semiconductor device structure of claim 10, further comprising a second dielectric material disposed on the sixth portion of the second spacer layer, wherein the second dielectric material surrounds the seventh portion of the second spacer layer.

14. The semiconductor device structure of claim 13, wherein the air gap has a width ranging from about 0.5 nm to about 6 nm.

15. The semiconductor device structure of claim 14, wherein the air gap has a height ranging from about 1 nm to about 20 nm.

16. The semiconductor device structure of claim 10, further comprising a third dielectric material disposed on the second dielectric material, the seventh portion of the second spacer layer, the sealing material, and the fifth portion of the first spacer layer.

17. A semiconductor device structure, comprising:
- a first conductive structure disposed over a substrate, wherein the first conductive structure comprises a first sidewall having a first portion and a second portion;
- a second conductive structure disposed adjacent the first conductive structure, wherein the second conductive structure comprises a second sidewall having a third portion and a fourth portion;
- a first dielectric material in contact with the second portion of the first sidewall and the fourth portion of the second sidewall;
- a first spacer layer comprising a fifth portion, a sixth portion, a seventh portion, an eighth portion, and a ninth portion, wherein the fifth portion is disposed on the first dielectric material, the sixth portion is in contact with the first portion of the first sidewall, the seventh portion is in contact with the third portion of the second sidewall, the eighth portion is disposed on the first conductive structure, and the ninth portion is disposed on the second conductive structure; and
- a second dielectric material disposed over the fifth portion of the first spacer layer, wherein a first air gap is formed between the second dielectric material and the sixth portion of the first spacer layer, and wherein a second air gap is formed between the second dielectric material and the seventh portion of the first spacer layer, wherein each of the first and second conductive structures comprises a first conductive feature and a second conductive feature disposed over the first conductive feature.

18. The semiconductor device structure of claim 17, wherein the first conductive structure further comprises a first barrier layer in contact with the first dielectric material and the sixth portion of the first spacer layer.

19. The semiconductor device structure of claim 18, wherein the second conductive structure further comprises a second barrier layer in contact with the first dielectric material and the seventh portion of the first spacer layer.

20. The semiconductor device structure of claim 19, further comprising a second spacer layer including a tenth portion, an eleventh portion, and a twelfth portion, wherein the tenth portion is disposed on and in contact with the fifth portion of the first spacer layer, the eleventh portion is in contact with the second dielectric material and exposed in the first air gap, and the twelfth portion is in contact with the second dielectric material and exposed in the second air gap.

* * * * *